United States Patent
Horiuchi et al.

(10) Patent No.: US 8,242,612 B2
(45) Date of Patent: Aug. 14, 2012

(54) WIRING BOARD HAVING PIERCING LINEAR CONDUCTORS AND SEMICONDUCTOR DEVICE USING THE SAME

(75) Inventors: Michio Horiuchi, Nagano (JP); Yasue Tokutake, Nagano (JP); Yuichi Matsuda, Nagano (JP); Tomoo Yamasaki, Nagano (JP); Yuta Sakaguchi, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 232 days.

(21) Appl. No.: 12/813,692

(22) Filed: Jun. 11, 2010

(65) Prior Publication Data

US 2011/0018144 A1    Jan. 27, 2011

(30) Foreign Application Priority Data

Jul. 21, 2009    (JP) .................................. 2009-170469

(51) Int. Cl.
*H01L 23/48*    (2006.01)
*H05K 1/00*    (2006.01)

(52) U.S. Cl. ........... 257/784; 257/E23.01; 257/E23.169; 257/E21.499; 257/E23.011; 257/E23.168; 257/668; 257/774; 257/773; 257/778; 257/737

(58) Field of Classification Search .................. 257/784, 257/E23.01, 668, 774, 773, E23.169, E21.499, 257/E23.011, E23.168; 174/267, 260, 255
See application file for complete search history.

(56) References Cited

U.S. PATENT DOCUMENTS

| | | | |
|---|---|---|---|
| 4,463,084 A | 7/1984 | Mitsumori et al. | |
| 6,093,476 A | 7/2000 | Horiuchi et al. | |
| 7,352,060 B2 * | 4/2008 | Shimizu et al. | 257/700 |
| 7,536,780 B2 * | 5/2009 | Shimizu et al. | 29/830 |
| 2008/0289866 A1 * | 11/2008 | Yuri et al. | 174/260 |
| 2009/0154054 A1 | 6/2009 | Masuda et al. | |
| 2010/0294552 A1 * | 11/2010 | Kobayashi et al. | 174/260 |
| 2010/0307808 A1 * | 12/2010 | Horiuchi et al. | 174/264 |
| 2011/0012266 A1 * | 1/2011 | Horiuchi et al. | 257/773 |
| 2011/0095433 A1 * | 4/2011 | Horiuchi et al. | 257/773 |
| 2011/0100700 A1 * | 5/2011 | Kariya et al. | 174/267 |
| 2011/0175235 A1 * | 7/2011 | Horiuchi et al. | 257/774 |
| 2011/0220404 A1 * | 9/2011 | Yamasaki et al. | 174/261 |

FOREIGN PATENT DOCUMENTS

| | | |
|---|---|---|
| JP | 58-137915 | 8/1983 |
| JP | 58-141595 | 8/1983 |
| JP | 10-308565 | 11/1998 |
| JP | 2004-273480 | 9/2004 |
| JP | 2009-147241 | 7/2009 |

* cited by examiner

*Primary Examiner* — A O Williams
(74) *Attorney, Agent, or Firm* — IPUSA, PLLC

(57) ABSTRACT

A wiring board includes a core substrate including an insulation base member; linear conductors configured to pierce from a first surface of the insulation base member to a second surface of the insulation base member; a ground wiring group including a first ground wiring formed on the first surface of the core substrate, and a belt-shaped second ground wiring formed on the second surface of the core substrate and electrically connected to the first ground wiring by way of a part of the linear conductors; and an electric power supply wiring group including a first electric power supply wiring formed on the first surface, and a second electric power supply wiring formed on the second surface and electrically connected to the first electric power supply wiring by way of a part of the plural linear conductors.

10 Claims, 23 Drawing Sheets

WIRING BOARD HAVING PIERCING LINEAR CONDUCTORS AND SEMICONDUCTOR DEVICE USING THE SAME

CROSS-REFERENCE TO RELATED APPLICATIONS

This patent application is based upon and claims the benefit of priority of Japanese Patent Application No. 2009-170469 filed on Jul. 21, 2009 the entire contents of which are incorporated herein by reference.

BACKGROUND OF THE INVENTION

1. Field of the Invention

The present invention generally relates to wiring boards and semiconductor devices. More specifically, the present invention relates to a wiring board inside which a capacitor is provided and a semiconductor device where a semiconductor element is mounted on the wiring board.

2. Description of the Related Art

Recently, in semiconductor elements, operational frequency has been increasing and consumption electric current is thus increased. Based on this, an operational voltage may be decreased due to the consumption electric current. Accordingly, in an electric power supply configured to supply electric power to a semiconductor element, a large change of electric current may be generated at a higher rate. It is extremely difficult to limit a voltage change of the electric power source due to change of the electric current within an allowable range of the electric power source.

Because of this, in a semiconductor device where a semiconductor element is mounted on a wiring board, plural capacitors are provided so that the change of the voltage of the electric power source is reduced. In other words, the change of the voltage of the electric power source is controlled by supplying an electric current from a chip capacitor to the semiconductor element by quick charging and discharging when an electric current has a high rate of change so that transitional change is made.

An example of a related art semiconductor device where the chip capacitor is provided is discussed with reference to FIG. 1 and FIG. 2. FIG. 1 is a cross-sectional view of an example of a related art semiconductor device. Referring to FIG. 1, a semiconductor device 300 includes a wiring board 500, a semiconductor element 400, solder bumps 410, and an underfill layer 420. A supporting body 510 is provided in a center part of the wiring board 500.

A first wiring layer 610a is formed on a first main surface 510a of the supporting body 510. A through-via hole 690 is formed in the supporting body 510 so as to pierce from the first main surface 510a to a second main surface 510b. The first wiring layer 610a is electrically connected to a fourth wiring layer 610b discussed below by way of the through-via hole 690. A first insulation layer 520a is formed so as to cover the first wiring layer 610a. A second wiring layer 620a is formed on the first insulation layer 520a. The first wiring layer 610a and the second wiring layer 620a are electrically connected to each other by way of a via-hole 520x piercing the first insulation layer 520a.

A second insulation layer 530a is formed so as to cover the second wiring layer 620a. A third wiring layer 630a is formed on the second insulation layer 530a. The second wiring layer 620a and the third wiring layer 630a are electrically connected to each other by way of a via-hole 530x piercing the second insulation layer 530a.

A solder resist film 550a having an opening part 550x is formed so as to cover the third wiring layer 630a. A part exposed from the opening part 550x of a solder resist film 550a of the third wiring layer 630a functions as an electrode terminal. In the following explanation, the part exposed from the opening part 550x of the solder resist film 550a of the third wiring layer 630a may be called an electrode terminal 630a. In the following explanation, a surface where the electrode terminal 630a is formed may be called a first main surface of the wiring board 500.

The fourth wiring layer 610b is formed on the second main surface 510b of the supporting body 510. A third insulation layer 520b is formed so as to cover the fourth wiring layer 610b. The fifth wiring layer 620b is formed on the third insulation layer 520b. The fourth wiring layer 610b and the fifth wiring layer 620a are electrically connected to each other by way of a via-hole 520y piercing the third insulation layer 520b.

In addition, a fourth insulation layer 530b is formed so as to cover the fifth wiring layer 620b. A sixth wiring layer 630b is formed on the fourth insulation layer 530b. The fifth wiring layer 620b and the sixth wiring layer 630b are electrically connected to each other by way of a via-hole 530y piercing the fourth insulation layer 530b.

In addition, a solder resist film 550b having an opening part 550y is formed so as to cover the sixth wiring layer 630b. A part exposed from the opening part 550y of the solder resist film 550b of the sixth wiring layer 630b functions as an electrode terminal. In the following explanation, the part exposed from the opening part 550y of the solder resist film 550b of the sixth wiring layer 630b may be called an electrode terminal 630b. In the following explanation, a surface where the electrode terminal 630b is formed may be called a second main surface of the wiring board 500.

A solder bump 680 is formed on a part of the electrode terminals 630b. The solder bump 680 functions as an outside connection terminal configured to be electrically connected to a corresponding terminal of a circuit wiring board when the semiconductor device 300 is mounted on the circuit wiring board. In addition, a chip capacitor 100 is mounted on a part of the electrode terminals 630b. Outside electrodes 260a and 260b of the chip capacitor 100 are electrically connected to the corresponding electrode terminals 630b.

A semiconductor element 400 is mounted on the first main surface of the wiring board 500. The semiconductor element 400 has a structure where a semiconductor integrated circuit (not shown) or an electrode terminal (not shown) is formed on a thin-plate, shaped semiconductor wiring substrate (not shown) made of silicon or the like. A solder bump 410 is formed on an electrode terminal (not shown) of the semiconductor element 400.

The electrode terminal (not shown) of the semiconductor element 400 is electrically connected to corresponding electrode terminal 630a of the wiring board 500 by the solder bump 410. As a material of the solder bump 410, for example, an alloy of Sn and Cu, an alloy of Sn and Ag, an alloy of Sn, Ag, and Cu, and other alloys can be used. The underfill resin layer 420 is supplied between the semiconductor element 400 and the solder resist layer 550a of the wiring board 500.

FIG. 2 is an expanded cross-sectional view of the chip capacitor 100 shown in FIG. 1. Referring to FIG. 2, the chip capacitor 100 includes a dielectric body 210, plural inside electrodes 220a and 220b, and two outside electrodes 260a and 260b.

The inside electrodes 220a and 220b are mutually stacked in a Z direction inside the dielectric body 210. The inside electrodes 220a and 220b are provided, in an area sandwiched by the outside electrodes 260a and 260b, substantially perpendicular to a surface 260a1 of the outside electrode 260a and a surface 260b1 of the outside electrode 260b facing each other. The inside electrodes 220a are connected to the outside electrode 260a. Plural inside electrodes 220b are connected to the outside electrode 260b. With this structure, a capacitor is formed between plural inside electrodes 220a and plural inside electrodes 220b.

In order to reduce the change in the voltage of the electric power supply generated by the operational electric current of the semiconductor element 400, for example, plural chip capacitors 100 shown in FIG. 2 are connected between the electric power supply of the semiconductor element 400 and ground (GND). Since it is difficult to arrange the chip capacitor 100 in the vicinity of the semiconductor element 400, it is normal practice for the chip capacitor 100 to be mounted on the second main surface of the wiring board 500, which second main surface is opposite to the first main surface where the semiconductor element 400 is mounted.

In other words, the ground (GND) and the electric power supply of the semiconductor element 400 are extended to the second main surface of the wiring board 500, where the chip capacitor 100 is mounted, by way of the wiring layer, the via-hole, the through-via hole, and others. Approximately 30 through 50 chip capacitors 100 are mounted on the second main surface of the wiring board 500. Each of the chip capacitors 100 has, for example, a capacitance of approximately 1 µF through approximately 10 µF, so that the entire wiring board 500 has capacitance of approximately 50 µF through approximately 100 µF. As a result, it is possible to reduce the change of the voltage of the electric power supply.

In a case where the semiconductor chip 40 is operated at high frequency, in order to reduce the change of the voltage of the electric power supply by using the chip capacitor 100, it is preferable that the chip capacitor 100 be arranged in the vicinities of the ground (GND) and the electric power supply of the semiconductor chip 400 as close as possible. However, as discussed above, the chip capacitor 100 is connected, by way of the wiring layer, the via-hole, the through-via hole, and others, between the ground (GND) and the electric power supply of the semiconductor chip 400. Accordingly, it is difficult to reduce the inductance generated by the wiring layer or the like. Hence, when the semiconductor chip 400 is operated at the high frequency, there is a limitation to reducing the change of the voltage of the electric power supply by using the chip capacitor 100. This is because, if the inductance becomes high, corresponding to the change of the electric current at the high rate, the chip capacitor 100 charging and discharging is obstructed.

In order to solve such a problem, a technique has been suggested where a capacitor having a structure similar with that shown in FIG. 2 is formed inside the wiring board 500. By forming the capacitor inside the wiring board 500, it is possible to provide the capacitor near the semiconductor chip 400.

In this case, it is preferable that pitches of the outside electrodes of the capacitor be made equal to pitches of the electrode terminals 410 formed on the semiconductor chip 400 and the capacitor be formed right under the electrode terminal 410 corresponding to the ground (GND) and the electric power supply of the semiconductor chip 400. In addition, it is preferable that one of the outside electrodes of the capacitor be connected to the electrode terminal 410 corresponding to the electric power supply of the semiconductor chip 400 and another of the outside electrodes of the capacitor be connected to the electrode terminal 410 corresponding to the ground (GNU) of the semiconductor chip 400.

Thus, by forming the capacitor inside the wiring board 500 and connecting the capacitor as discussed above, it is possible to reduce the inductance generated by the wiring layer or the like.

In addition, it is possible to reduce the change of the voltage of the electric power supply more, compared to the conventional art, in a case where the semiconductor chip 400 is operated at high frequency. See Japanese Laid-Open Patent Application Publication No. 10-308565.

However, as miniaturization of the semiconductor device 300 or making the semiconductor device 300 thinner progresses, pitches of the electrode terminals 410 formed on the semiconductor chip 400 are made narrower. That is, high density of the electrode terminals 410 has been progressing. As the pitches of the electrode terminals 410 are narrower, it is necessary to make pitches of the outside electrodes of the capacitor to be connected to the electrode terminals 410 narrower.

In the related art capacitor, the inside electrodes are provided in a direction perpendicular to the thickness direction of the wiring board. Therefore, if the pitch of the outside electrodes of the capacitor is narrower, it may not be possible to make the area of the inside electrodes of the capacitor large. If the area of the inside electrodes of the capacitor is smaller, in proportion to that, the capacitance of the capacitor is smaller. Hence, it is difficult to reduce the change of the voltage of the electric power supply.

SUMMARY OF THE INVENTION

Accordingly, embodiments of the present invention may provide a novel and useful wiring board and semiconductor device solving one or more of the problems discussed above.

More specifically, the embodiments of the present invention may provide a wiring board inside which a capacitor is provided, which capacitor can correspond to mass storage, which wiring board can reduce inductance between the capacitor and a semiconductor element when the semiconductor element is mounted on the wiring board, and a semiconductor device where the semiconductor element is mounted on the wiring board.

Another aspect of the embodiments of the present invention may be to provide a wiring board, including:
a core substrate, the core substrate including
an insulation base member including inorganic dielectric, and
a plurality of linear conductors, the linear conductors being configured to pierce from a first surface of the insulation base member to a second surface of the insulation base member;
a ground wiring group, the ground wiring group including
a belt-shaped first ground wiring formed on the first surface of the core substrate, and
a belt-shaped second ground wiring formed on the second surface of the core substrate so as to face the first ground wiring, the second ground wiring being electrically connected to the first ground wiring by way of a part of the plural linear conductors; and
an electric power supply wiring group, the electric power supply wiring group including
a belt-shaped first electric power supply wiring formed on the first surface of the core substrate, and
a belt-shaped second electric power supply wiring formed on the second surface of the core substrate so as to face the first electric power supply wiring, the second electric power supply wiring being electrically connected to the first electric power supply wiring by way of a part of the plural linear conductors;

wherein the ground wiring group and the electric power supply wiring group are formed by way of the insulation base member.

Another aspect of the embodiments of the present invention may be to provide a semiconductor device, including:

the wiring board as mentioned above; and a semiconductor element mounted on the wiring board, wherein the belt shaped first ground wiring is provided right under a plurality of electrode terminals corresponding to a ground of the semiconductor element; and the belt shaped first electric power supply wiring is provided right under a plurality of electrode terminals corresponding to an electric power supply of the semiconductor element.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

DETAILED DESCRIPTION OF THE PREFERRED EMBODIMENTS

A description is given below, with reference to the FIG. 3 through FIG. 23 of embodiments of the present invention.
(First Embodiment)
[Structure of Semiconductor Device of the First Embodiment]

Figure 3:
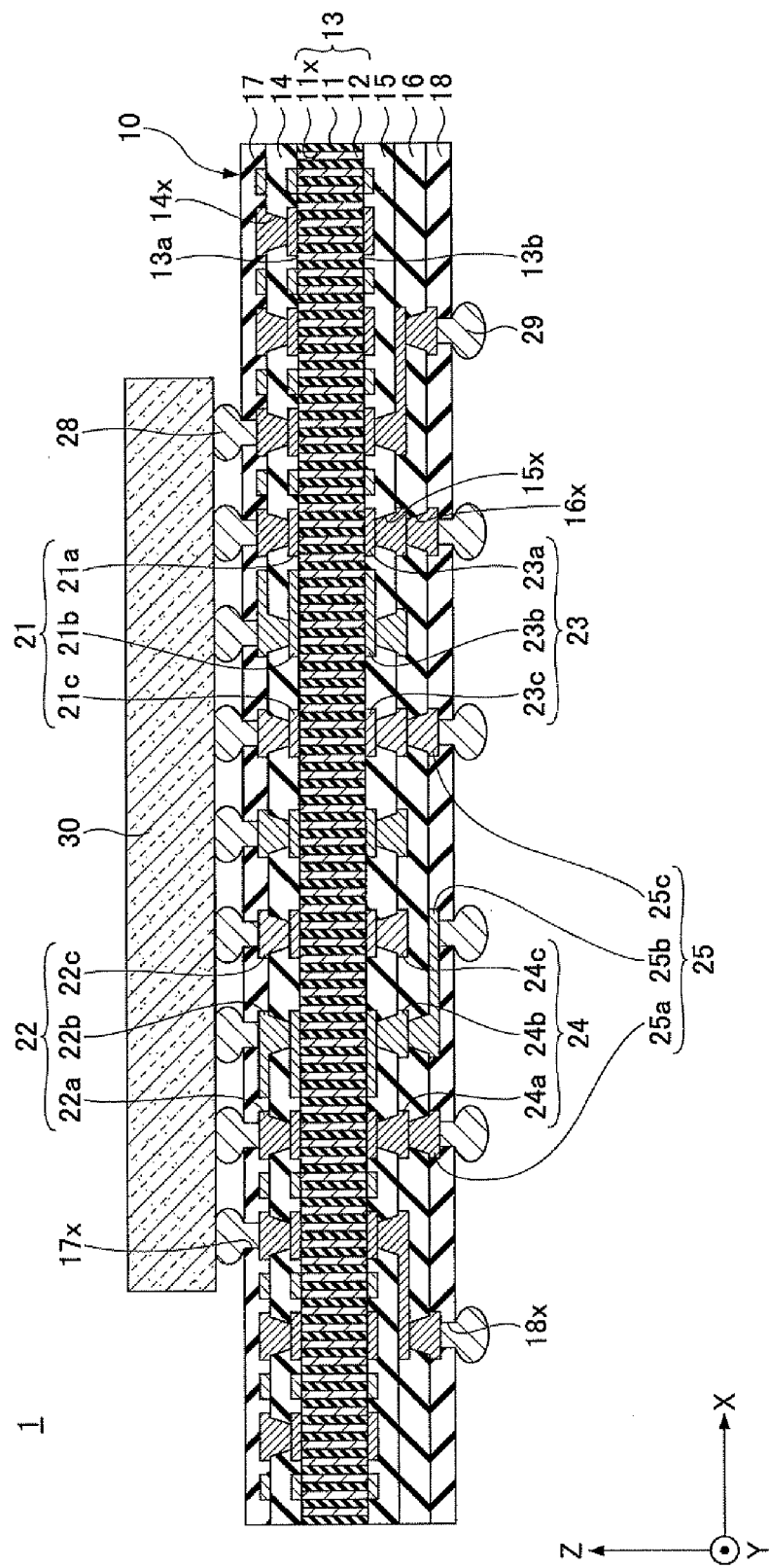
FIG. 3 is a cross-sectional view of an example of a semiconductor device of a first embodiment of the present invention.

First, a structure of a semiconductor device of the first embodiment of the present invention is discussed. FIG. 3 is a cross-sectional view of an example of the semiconductor device of the first embodiment of the present invention. In FIG. 3, an X direction indicates a direction parallel with a surface (first surface) 13a of a core substrate 13 discussed below. A Y direction (a depth direction of the drawing) indicates a direction perpendicular to the X direction. A Z direction (a thickness direction of the core substrate 13) indicates a direction perpendicular to the X direction and the Y direction.

Referring to FIG. 3, a semiconductor device 1 of the first embodiment of the present invention has a structure where a semiconductor element 30 is mounted on a wiring board 10.

The wiring board 10 includes the core substrate 13, a first insulation layer 14, a second insulation layer 15, a third insulation layer 16, a first solder resist layer 17, a second solder resist layer 18, a first wiring layer 21, a second wiring layer 22, a third wiring layer 23, a fourth wiring layer 24, a fifth wiring layer 25, first solder bumps 28, and second solder bumps 29.

The core substrate 13 of the wiring board 10 has a thickness of, for example approximately 70 μm through approximately 100 μm and a size of approximately 10 mm×10 mm. A large number of piercing holes 11x are formed in an entire insulation base member 11 in the Z direction (thickness direction). Metal materials are supplied in the piercing holes 11x so that linear conductors (vias) 12 are formed. For example, a material having a high dielectric constant (inorganic dielectric), such as alumina (aluminum oxide), mullite, aluminum nitride, glass-ceramics (a composite material of glass and ceramics), BST (barium strontium titanate), barium titanate, strontium titanate, or PZT (lead zirconate titanate), can be used as a material of the insulation base member 11. For example, the dielectric constant of alumina (aluminum oxide) is 8 through 10 and the dielectric constant of mullite is 6.5.

In a case where the semiconductor element 30 mounted on the wiring board 10 is made of, for example, silicon, the semiconductor element 30 has a CTE (coefficient of thermal expansion) of approximately 3 ppm/° C. In addition, in a case where the first wiring layer 21 formed in the wiring board 10 is made of, for example, copper (Cu), the first wiring layer 21 has CTE (coefficient of thermal expansion) of approximately 16 ppm/° C. through approximately 17 ppm/° C. By using, for example, alumina, mullite, or ceramics as the material of the insulation base member 11, it is possible to ease a stress generated based on the difference of the CTE (coefficients of thermal expansion) of the semiconductor element 30 and the CTE (coefficients of thermal expansion) of the first wiring layer 21. This is because, for example, alumina has a CTE (coefficient of thermal expansion) of approximately 6 ppm/° C. through approximately 7 ppm/AD. Mullite has a CTE (coefficient of thermal expansion) of approximately 4.5 ppm/° C. Ceramics has a CTE (coefficient of thermal expansion) close to an intermediate value of the CTE (coefficients of thermal expansion) of the semiconductor element 30 and the CTE (coefficients of thermal expansion) of the first wiring layer 21.

One end surface of the linear conductor 12 is exposed at the surface 13a of the core substrate 13. Another end surface of the linear conductor 12 is exposed at another surface (second surface) 13b of the core substrate 13. The linear conductor 12 has, for example, a circular shaped configuration in planar view. A diameter of the linear conductor 12 can be, for example, approximately 30 nm through approximately 2000 nm. Here, the planar view means a view of a subject seen in the Z direction in FIG. 3. Furthermore, the linear conductors 12 may be closely spaced so that a gap between neighboring linear conductors 12 is smaller than the diameter of the liner conductors 12. However, there is no limitation of arrangement of the linear conductors 12. The linear conductors 12 may be arranged in, for example, a hexagonal manner or a grid manner.

The linear conductor 12 functions as a via configured to connect a conductor formed at the surface 13a of the core substrate 13 and a conductor formed at the other surface 13b of the core substrate 13. A part of the linear conductors 12 may not be connected to the conductor so as to be electrically isolated (floating). More specifically, the linear conductors may include a first linear conductor connected to a signal wire, a second linear conductor surrounding the first linear conductor and connected to a ground wiring, and a third linear conductor provided between the first linear conductor and the second linear conductor; and being electrically not-connected and isolated. As the metal material of the linear conductors (via plugs) 12, for example, silver (Ag), copper (Cu), nickel (Ni), or the like can be used.

Here, the core substrate 13 of the first embodiment of the present invention and a related art wiring board are compared. In the related art wiring board, it is necessary to form through-holes (and supply conductors) in the core substrate as a part configured to electrically connect the wiring layers provided at both sides of the core substrate and also necessary to form pads on both surfaces of the formed and filled through-holes. In addition, when the through-holes including the pads are formed, it is necessary to prepare specific core substrates, one by one, based on the functions of the chip components to be mounted and necessary to apply processes of forming the holes in the prepared core substrates and embedding metal the holes. Because of this, it takes a long time to manufacture the core substrate and therefore it is not possible to efficiently manufacture the core substrate. In this case, the cost of the core substrate increases.

In addition, in the related art wiring board, depending on process precision or alignment precision of the through-hole relative to the core substrate or stacking precision of the wiring layers, it is necessary to make the diameter of the pads large. Because of this, a design freedom of wiring is obstructed so that the wiring density is limited. In particular, accompanying further miniaturization of electronic devices, there is a limitation of the pitches or diameters of the through-holes in the present technique. Therefore, the wiring density of the entire wiring board is further limited.

In the wiring board 10 of the first embodiment of the present invention, by a large number of the linear conductors 12 piercing from the surface 13a of the core substrate 13 to another surface 13b of the core substrate 13, the conductor formed on the surface 13a of the core substrate 13 and the conductor formed on the surface 13b of the core substrate 13 are connected to each other. Therefore, it is possible to avoid problems mentioned above of the related art wiring board.

Referring back to FIG. 3, the first wiring layer 21 is formed on the surface 13a of the core substrate 13. The first wiring layer 21 includes a signal wiring 21a, a ground wiring 21b and an electric power supply wiring 21c. The first wiring layer 21 is electrically connected to end surfaces of a large number of linear conductors 12 exposed at the surface 13a of the core substrate 13. For example, copper (Cu) or the like can be used as a material of the first wiring layer 21.

The first insulation layer 14 is formed on the surface 13a of the core substrate 13 so as to cover the first wiring layer 21. As a material of the first insulation layer 14, a resin material such as epoxy group resin or polyimide group resin can be used.

The second wiring layer 22 is formed on the first insulation layer 14. The second wiring layer 22 includes a signal wiring 22a, a ground wiring 22b, and an electric power supply wiring 22c. The signal wiring 22a, the ground wiring 22b, and the electric power supply wiring 22c of the second wiring layer 22 are electrically connected to the signal wiring 21a, the ground wiring 21b, and the electric power supply wiring 21c of the first wiring layer 21, respectively, by way of first via-holes 14x piercing the first insulation layer 14. For example, copper (Cu) or the like can be used as a material of the second wiring layer 22.

The first solder resist layer 17 is formed on the first insulation layer 14 so as to cover the second wiring layer 22. The first solder resist layer 17 includes opening parts 17x. A part of the second wiring layer 22 is exposed in the opening parts 17x.

The first solder bumps 28 are formed on the second wiring layer 22 exposed in the opening parts 17x of the first solder resist layer 17. As a material of the first solder bumps 28, for example, an alloy including Pb, an alloy of Sn and Cu, an alloy of Sn and Ag, an alloy of Sn, Ag, and Cu, and other alloys can be used. The first solder bumps 28 are electrically connected to corresponding electrode terminals (not shown) of the semiconductor element 30. Instead of the first solder bumps 28, metal pins or the like can be used.

The third wiring layer 23 is formed on the surface 13b of the core substrate 13. The third wiring layer 23 is electrically connected to end surfaces of a large number of the linear conductors 12 exposed at the surface 13b of the core substrate 13. The third wiring layer 23 includes a signal wiring 23a, a ground wiring 23b, and an electric power supply wiring 23c.

The signal wiring 23a, the ground wiring 23b, and the electric power supply wiring 23c of the third wiring layer 23 are formed in positions corresponding to the signal wiring 21a, the ground wiring 21b, and the electric power supply wiring 21c of the first wiring layer 21 (positions where the signal wiring 23a, the ground wiring 23b, and the electric power supply wiring 23c of the third wiring layer 23 are overlapped with the signal wiring 21a, the ground wiring 21b, and the electric power supply wiring 21c of the first wiring layer 21). In other words, the signal wiring 23a, the ground wiring 23b, and the electric power supply wiring 23c of the third wiring layer 23 are electrically connected to the signal wiring 21a, the ground wiring 21b, and the electric power supply wiring 21c of the first wiring layer 21 by way of a large number of the linear conductors 12.

The second insulation layer 15 is formed on the surface 13b so as to cover the third wiring layer 23. As a material of the second insulation layer 15, a resin material such as epoxy group resin or polyimide group resin can be used.

The fourth wiring layer 24 is formed on the second insulation layer 15. The fourth wiring layer 24 includes a signal wiring 24a, a ground wiring 24b, and an electric power supply wiring 24c. The signal wiring 24a, the ground wiring 24b, and the electric power supply wiring 24c of the fourth wiring layer 24 are electrically connected to the signal wiring 23a, the ground wiring 23b, and the electric power supply wiring 23c of the third wiring layer 23 by way of second via-holes 15x piercing the second insulation layer 15. For example, copper (Cu) or the like can be used as a material of the fourth wiring layer 24.

The third insulation layer 16 is formed on the second insulation layer 15 so as to cover the fourth wiring layer 24. As a material of the third insulation layer 16, a resin material such as epoxy group resin or polyimide group resin can be used.

The fifth wiring layer 25 is formed on the third insulation layer 16. The fifth wiring layer 25 includes a signal wiring 25a, a ground wiring 25b, and an electric power supply wiring 25c. The signal wiring 25a, the ground wiring 25b, and the electric power supply wiring 25c of the fourth wiring layer 25 are electrically connected to the signal wiring 24a, the ground wiring 24b, and the electric power supply wiring 24c of the fourth wiring layer 24 via third via-holes 16x piercing the third insulation layer 16. For example, copper (Cu) or the like can be used as a material of the fifth wiring layer 25.

The second solder resist layer 18 is formed on the third insulation layer 16 so as to cover the fifth wiring layer 25. The second solder resist layer 18 includes opening parts 18x. A part of the fifth wiring layer 25 is exposed in the opening parts 18x.

The second solder bumps 29 are formed on the fifth wiring layer 25 exposed in the opening parts 18x of the second solder resist layer 18. As a material of the second solder bumps 29, for example, an alloy including Pb, an alloy of Sn and Cu, an alloy of Sn and Ag, an alloy of Sn, Ag, and Cu, and others can be used. The second solder bumps 29 function as outside connection terminals configured to, for example, connect to a motherboard or the like.

As the outside connection terminals, instead of the second solder bumps 29, metal pins or the like can be used. In addition, the outside connection terminals such as the second solder bumps 29, the metal pins, or the like may not be provided. In this case, depending on necessity, the outside connection terminals may be formed on the fifth wiring layer 25 exposed in the opening parts 18x.

The semiconductor element 30 is mounted on the wiring board 10. Electrode terminals (not shown) of the semiconductor element 30 are electrically connected to the second wiring layer 22 by way of the first solder bumps 28. The semiconductor element 30 has a structure where a semiconductor integrated circuit (not shown) or the electrode terminal (not shown) is formed on a thin-plate shaped semiconductor wiring substrate made of silicon. The semiconductor element 30 may have the thickness of approximately 10 μm through approximately 50 μm.

Figure 4:
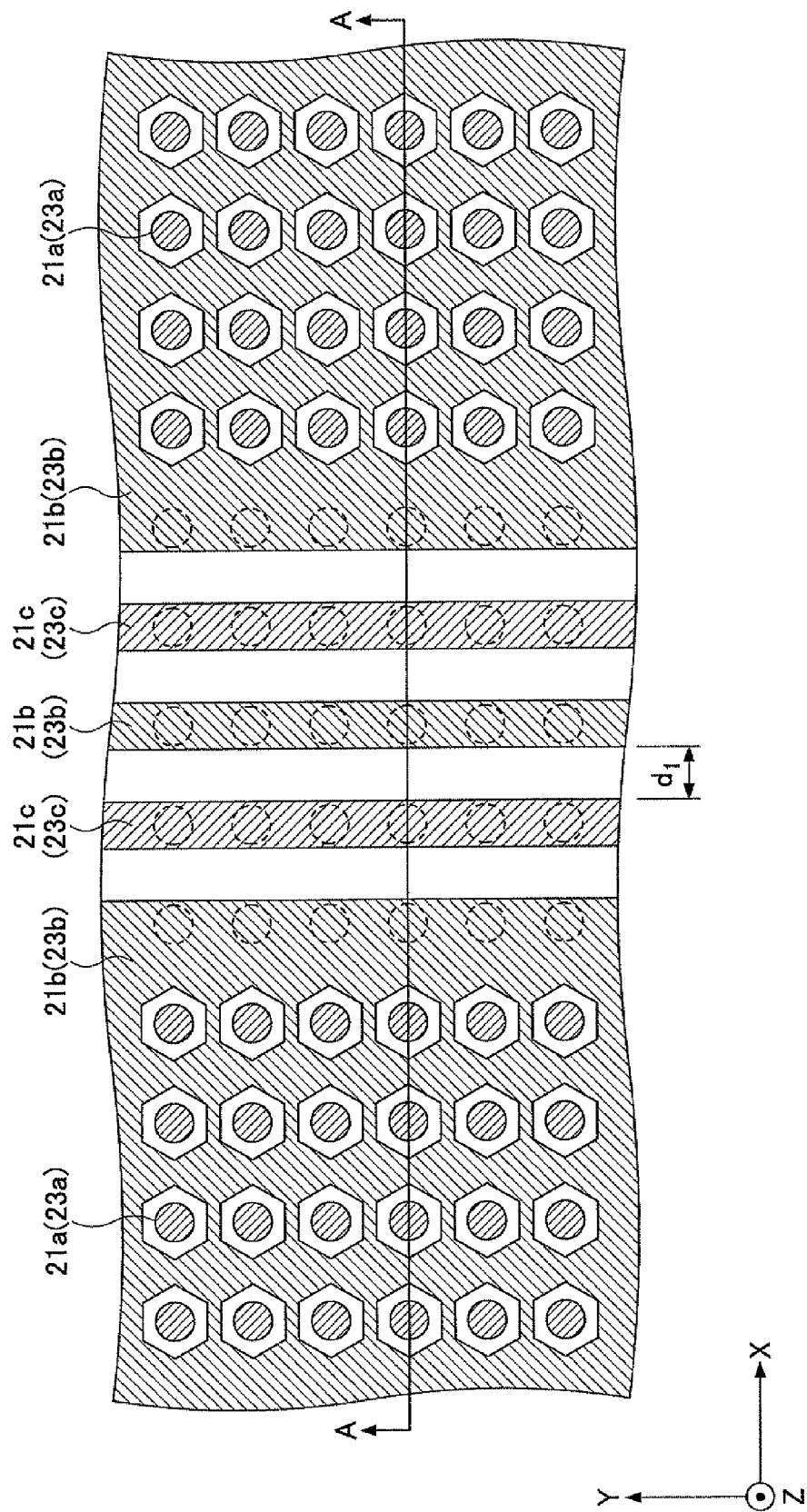
FIG. 4 is a plan view of an example of a layout of a first wiring layer and a third wiring layer of a wiring board of the first embodiment of the present invention.
Figure 5:
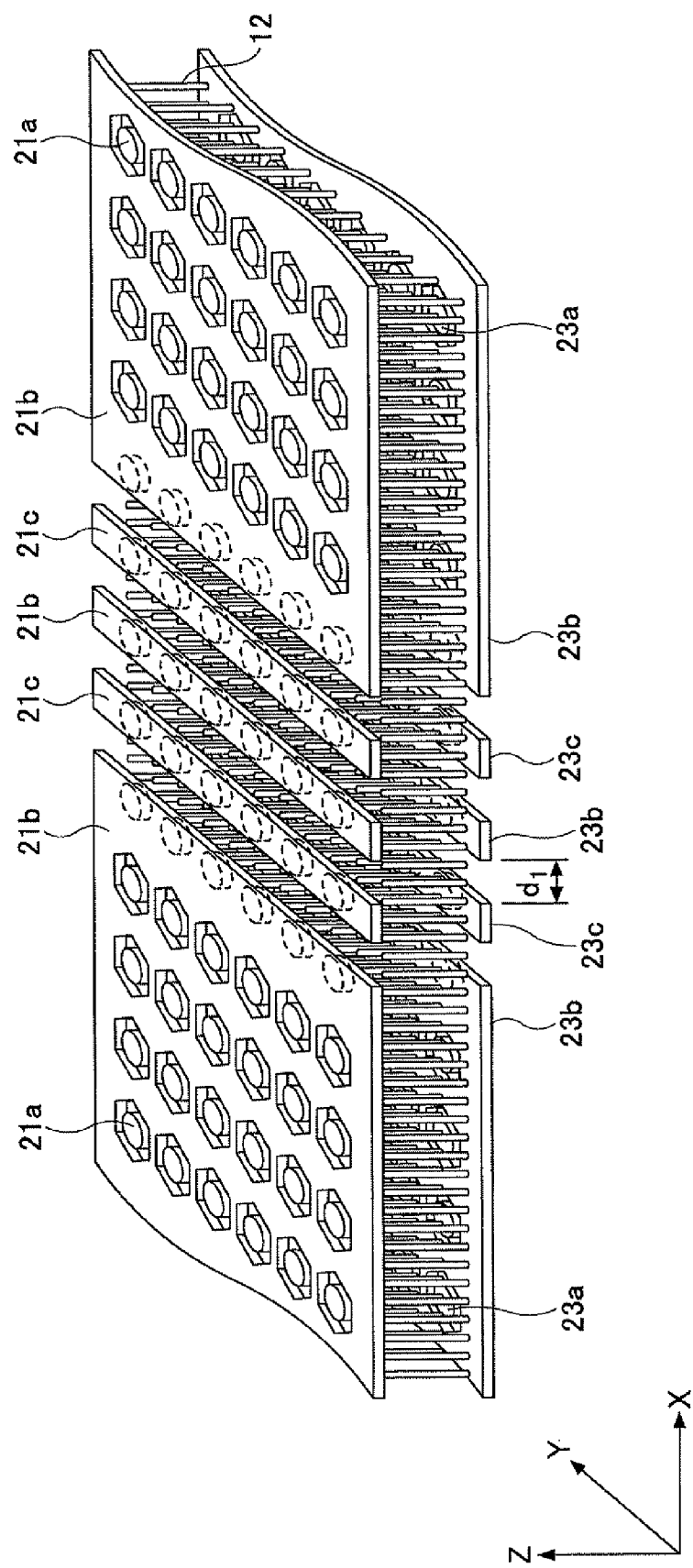
FIG. 5 is a perspective view of an example of a layout of the first wiring layer and the third wiring layer of the wiring board of the first embodiment of the present invention.

Next, a layout of the first wiring layer 21 and the third wiring layer 23 arranged so as to face the first wiring layer 21 by way of the core substrate 13 is discussed with reference to FIG. 4 and FIG. 5. FIG. 4 is a plan view of an example layout of the first wiring layer 21 and the third wiring layer 23 of a wiring board 10 of the first embodiment of the present invention. FIG. 5 is a perspective view of an example layout of the first wiring layer 21 and the third wiring layer 23 of the wiring board 10 of the first embodiment of the present invention. Referring to FIG. 4 and FIG. 5, the belt-shaped ground wiring 21b and the belt-shaped electric power supply wiring 21c are mutually arranged in the X direction. A belt-shaped ground wiring 23b and a belt-shaped electric power supply wiring 23c are mutually arranged in the X direction. In addition, the belt-shaped ground wiring 21b and the belt-shaped ground wiring 23b are electrically connected to each other by way of a large number of the linear conductors 12. The belt-shaped electric power supply wiring 21c and the belt-shaped electric power supply wiring 23c are electrically connected to each other by way of a large number of the linear conductors 12.

Thus, a ground wiring group (hereinafter a ground wiring group A) having the belt-shaped ground wirings 21b and 23b and a large number of the linear conductors 12 configured to connect the ground wirings 21b and 23b and an electric power supply wiring group (hereinafter an electric power supply wiring B) having the belt-shaped electric power supply wirings 21c and 23c and a large number of the linear conductors 12 configured to connect the electric power supply wirings 21c and 23c are mutually arranged by way of the insulation base member 11. In other words, the insulation base member 11 is arranged between the ground wiring group A and the electric power supply wiring group B, in a thickness direction of the core substrate 13. In addition, the insulation base member 11 is made of an inorganic dielectric having a high dielectric constant such as alumina (aluminum oxide).

In other words, the ground wiring group A and the electric power supply wiring group B are mutually arranged by way of the inorganic dielectric (insulation base member 11) so that a capacitor (hereinafter built-in capacitor) is formed. In the built-in capacitor, the ground wiring group A works as one electrode and the electric power supply wiring group B works as another electrode. A distance $d_1$ between the ground wiring group A and the electric power supply wiring group B, namely a distance between the electrodes of the built-in capacitor, can be, for example, approximately 5 μm. As the distance $d_1$ is narrower, the capacity of the built-in capacitor can be larger. In addition, as an area of a surface where the ground wiring group A and the electric power supply wiring group B face each other is greater, the capacity of the built-in capacitor can be larger. Thus, the capacitor is built in the wiring board 10 and the built-in capacitor can correspond to large capacity.

Furthermore, with reference to FIG. 3 through FIG. 5, the ground wiring group A which is one electrode of the built-in capacitor is provided right under an electrode terminal corresponding to the ground (GND) of the semiconductor element 30. In addition, the electric power supply wiring group B which is another electrode of the built-in capacitor is provided right under an electrode terminal corresponding to the electric power supply of the semiconductor element 30. In other words, the semiconductor element 30 and the built-in capacitor of the wiring board 10 can be electrically connected to each other by an extremely short wiring. With this structure, when the semiconductor element 30 is mounted on the wiring board 10, inductance between the semiconductor element 30 and the built-in capacitor can be reduced.

The signal wiring 21a is, by a large number of the linear conductors 12, electrically connected to the signal wiring 23a provided so as to face the signal wiring 21a by way of the core substrate 13. In addition, the signal wirings 21a and 23a and a large number of the linear conductors 12 connecting the signal wirings 21a and 23a (hereinafter a signal wire group C or a first linear conductor) is surrounded by the ground wires 21b and 23b and a large number of the linear conductors 12 connecting the ground wires 21b and 23b (hereinafter a ground wire group D or a second linear conductor). There is a designated gap between the signal wire group C and the ground wire group D.

A structure where the periphery of the signal wire group C is surrounded by the ground wire group D is the same as a structure of a coaxial line. Therefore, it is possible to achieve a shield effect. In addition, the ground wire group D is provided between the neighboring signal wire groups C. Accordingly, it is possible to reduce electrical coupling (capacity coupling) generated between the neighboring signal wire groups C, so that it is possible to prevent the signal wire groups C from being a noise source.

(Manufacturing Method of the Semiconductor Device of the First Embodiment)

Next, a manufacturing method of the semiconductor device of the first embodiment of the present invention is discussed.

Figure 1:
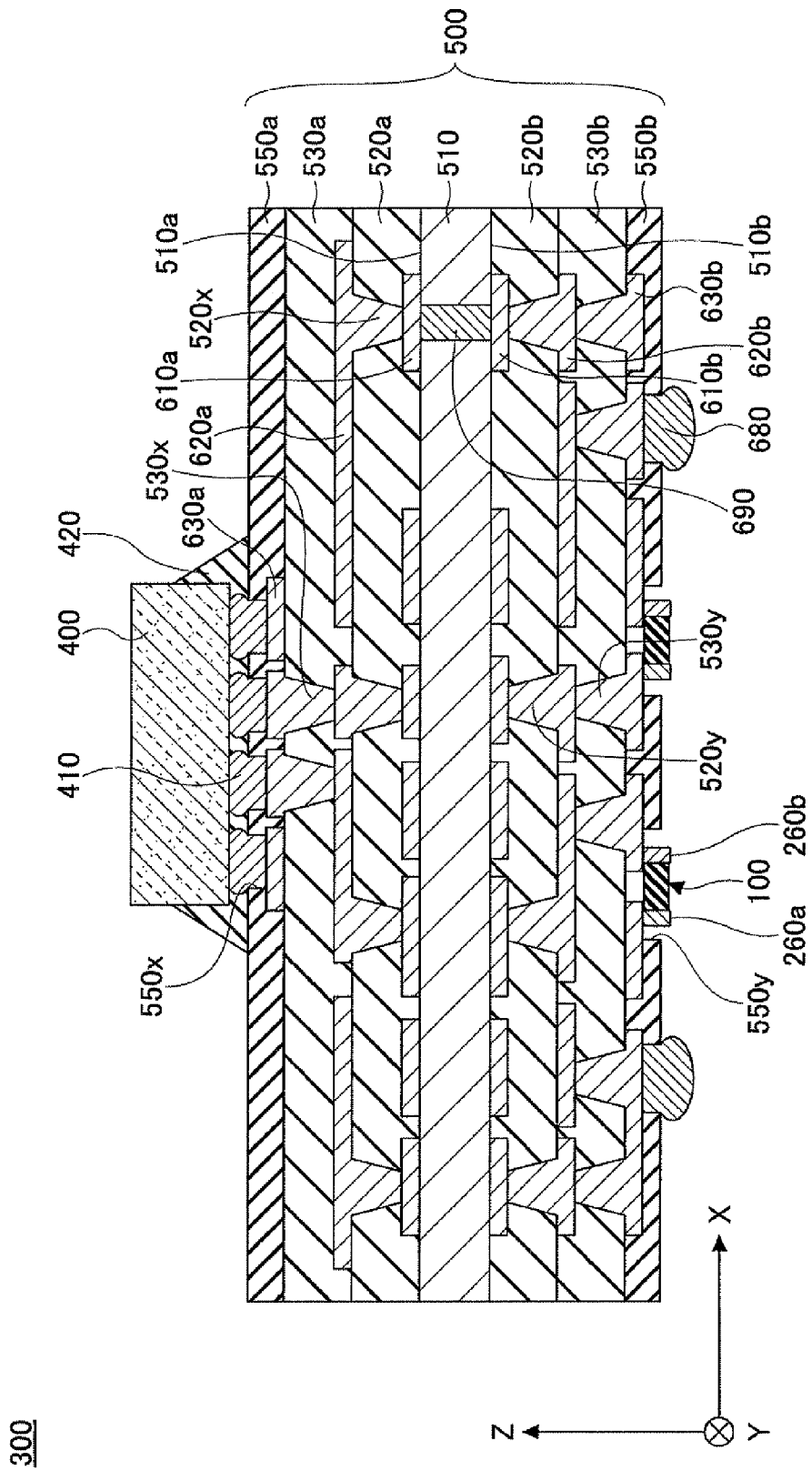
FIG. 1 is a cross-sectional view of an example of a related art semiconductor device.
Figure 2:
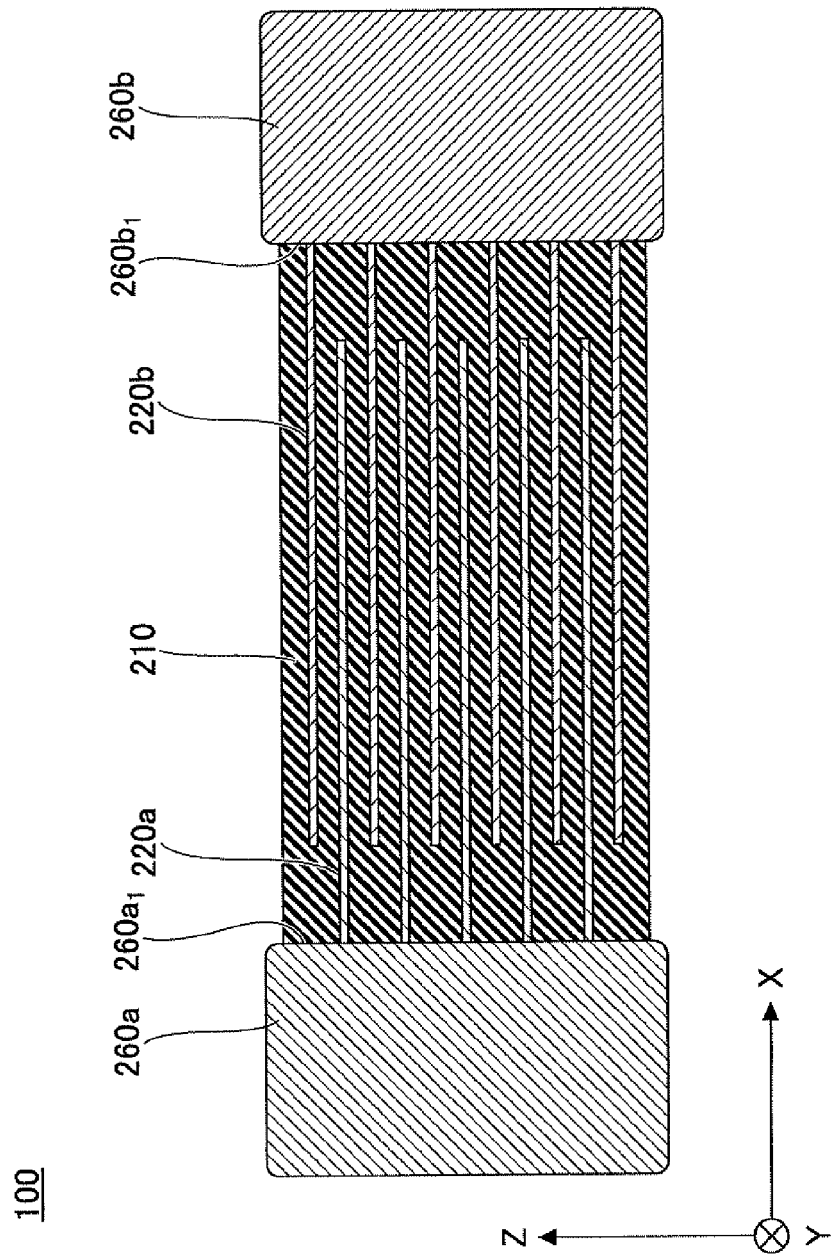
FIG. 2 is an expanded cross-sectional view of a chip capacitor shown in FIG. 1.

FIG. 6 through FIG. 15 are first through tenth views of the examples of the manufacturing method of the semiconductor device of the first embodiment of the present invention. In FIG. 6 through FIG. 15, parts that are the same as the parts shown in FIG. 1 are given the same reference numerals, and explanation thereof is omitted.

Figure 6:
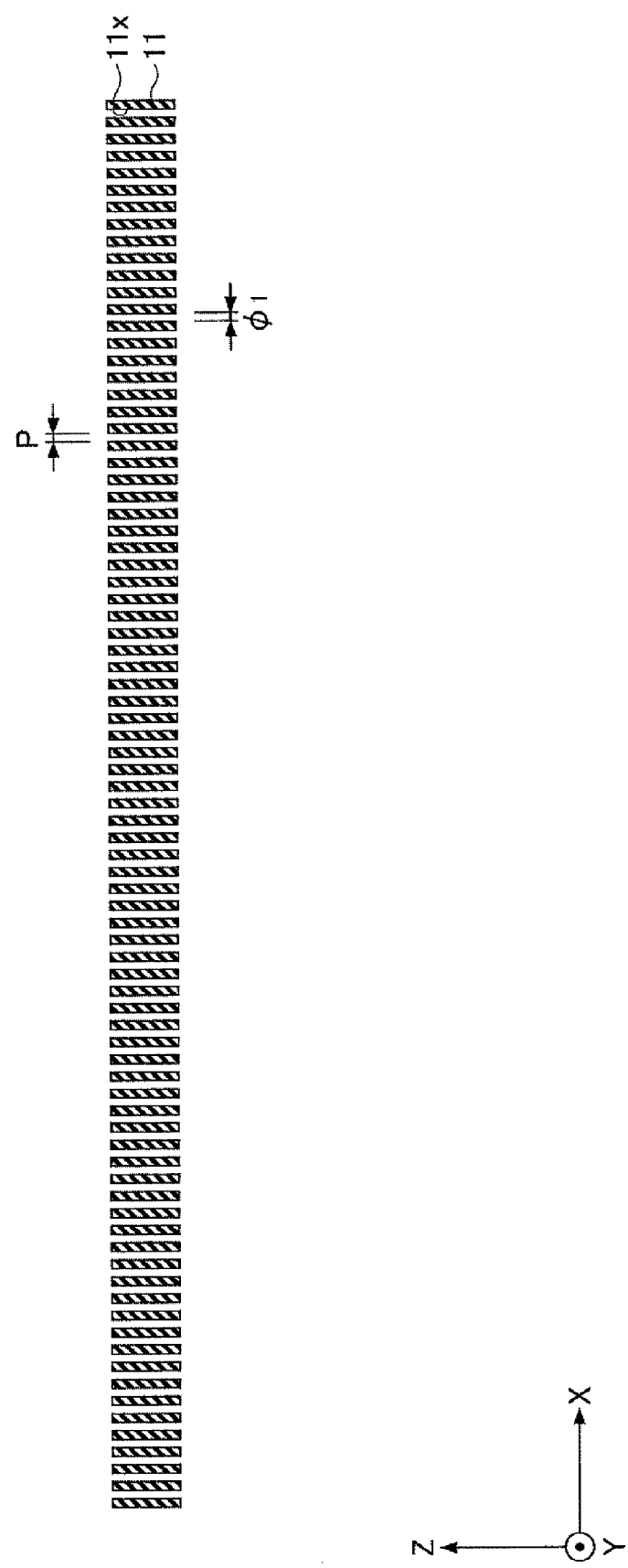
FIG. 6 is a first view of an example of a manufacturing method of the semiconductor device of the first embodiment of the present invention.

First, in a step shown in FIG. 6, the insulation member 11 is prepared. A large number of piercing holes 11x are formed in a thickness direction of the entire prepared insulation base member 11. As the insulation base member 11, a green sheet or the like made of alumina (aluminum oxide) having thickness of, for example approximately 70 μm through approximately 100 μm and a size of approximately 10 mm×10 mm can be used.

The piercing hole 11x has, for example, a circular $\phi_1$ shaped configuration in planar view. A diameter of the circular shaped configuration can be, for example, approximately 30 nm through approximately 2000 nm. Furthermore, the piercing holes 11x may be closely spaced so that a gap between neighboring piercing holes 11x is smaller than the diameter $\phi_1$ of the piercing hole 11x. However, there is no limitation of arrangement of the piercing holes 11x. The piercing holes 11x may be arranged in, for example, a hexagonal manner or a grid manner.

An example of a forming method of the piercing hole 11 is discussed. The piercing holes 11x can be formed by using an anodic oxidation coating. More specifically, an Al (aluminum) wiring board where insulating coating is applied to one surface of a wiring board made of Al, or an Al electrode layer formed on a glass wiring board by a sputtering method or the like, is prepared. After the surface of the prepared Al wiring board or Al electrode layer is cleaned, the Al wiring board or Al electrode is soaked in electrolytic solution (such as sulfuric acid solution). Energizing is performed (a pulse voltage is applied) where the soaked Al wiring board or Al electrode is used as an anode and a platinum (Pd) electrode facing the soaked Al wiring board or Al electrode is used as a cathode. As a result of this, a porous metal oxide film (such as an aluminum oxide film where holes having minute diameters are regularly well formed) can be formed on the surface of the Al wiring board or Al electrode.

After this, by applying voltages having electric potentials opposite to those in the case of anodic oxidation to each of the electrodes (by energizing where the Al wiring board or Al electrode is used as the cathode and the platinum (Pd) electrode is used as the anode), the porous metal oxide film is separated from the Al wiring board or Al electrode. As a result of this, the insulation base material 11 is obtained in which the piercing holes 11x having desirable minute diameters (for example, approximately 30 nm through approximately 2000 nm) are formed with high density. For example, alumina (aluminum oxide), mullite, aluminum nitride, glass-ceramics (a composite material of glass and ceramics), BST (barium strontium titanate), barium titanate, strontium titanate, or PZT (lead zirconate titanate), can be used as a material of the insulation base member 11.

Figure 7:
FIG. 7 is a second view of the example of the manufacturing method of the semiconductor device of the first embodiment of the present invention.

Next, in a step shown in FIG. 7, a metal material is supplied in the piercing holes 11x formed in the insulation base member 11 so that the linear conductors (vias) 12 are formed. In the following explanation, the insulation base member 11 having the linear conductors 12 may be called the core substrate 13. The linear conductors 12 can be formed by supplying a conductive paste of, for example, silver (Ag) or copper (Cu) into the piercing holes 11x by, for example, a screen printing method or a inkjet method.

In a case where, for example, copper (Cu) is used as the metal material, first, a seed layer is formed on a surface of the insulation base member 11 (including internal wall surfaces of the piercing holes 11x) by an electroless copper (Cu) plating method. By the electrolytic copper (Cu) plating method where the formed seed layer is used as a feeding layer, copper (Cu) can be supplied in the piercing holes 11x. In addition, by only the electroless copper (Cu) plating method, copper (Cu) may be supplied in the piercing holes 11x.

Furthermore, if necessary, both surfaces of the insulation base member 11 are polished and made planar by mechanical polishing, CMP (chemical-mechanical polishing), or the like, so that both ends of the linear conductors 12 can be exposed at respective surfaces of the insulation base member 11. As a result of this, it is possible to form the core substrate 13 where the linear conductors 12 piercing the insulation base member 11 in the thickness direction of the insulation base member 11, the linear conductors 12 having the minute diameters, are provided with high density.

Figure 8:
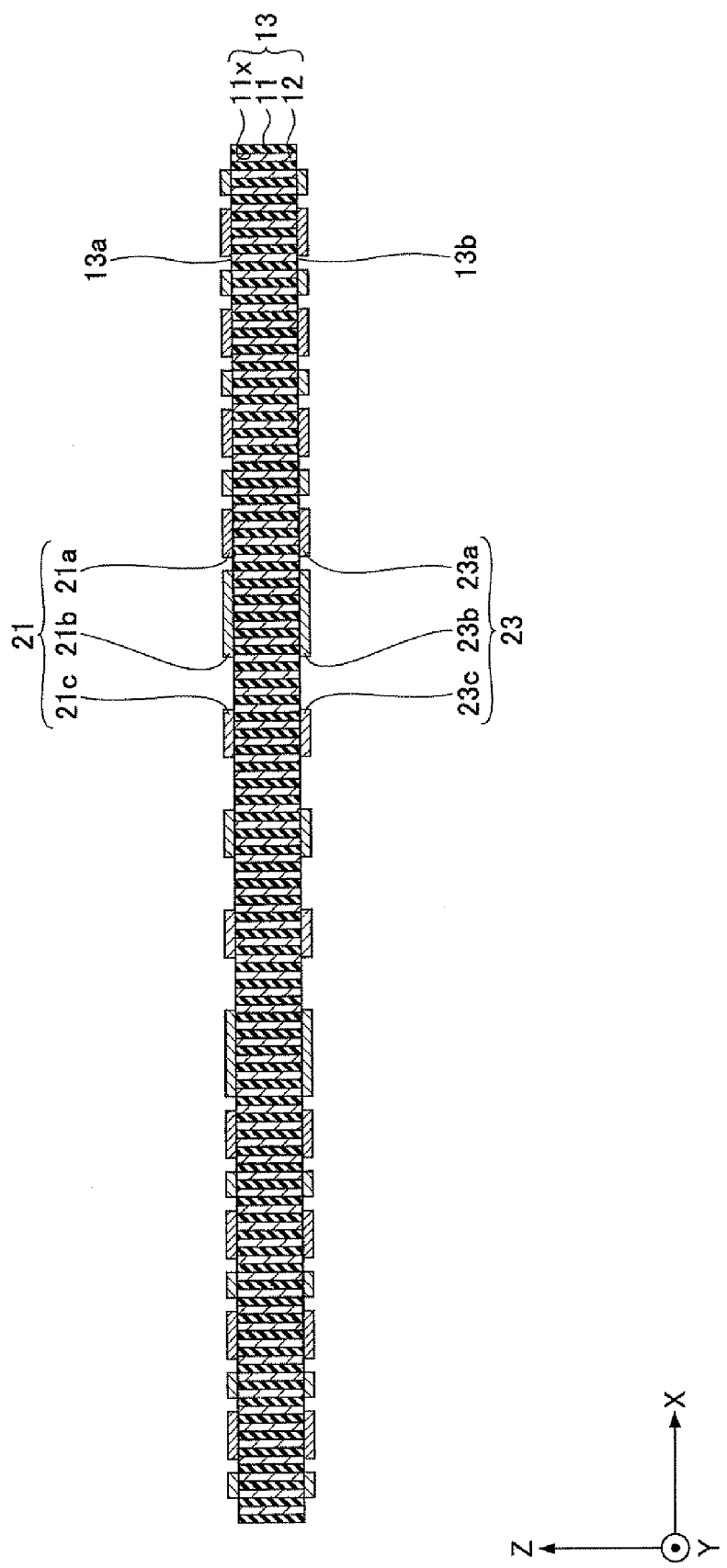
FIG. 8 is a third view of the example of the manufacturing method of the semiconductor device of the first embodiment of the present invention.

Next, in a step shown in FIG. 8, the first wiring layer 21 is formed on the surface 13a of the core substrate 13 formed in the step shown in FIG. 7. In addition, the third wiring layer 23 is formed in a position facing the first wiring layer 21 formed on the surface 13b of the core substrate 12. The first wiring layer 21 and the third wiring layer 23 can be formed by, for example a sputtering method or a plating method. Copper (Cu) or the like, for example, can be used as the material of the first wiring layer 21 and the third wiring layer 23. By this step, the first wiring layer 21 and the third wiring layer 23 facing each other by way of the core substrate 13 are electrically connected to each other by way of a large number of the linear conductors 12. An example of the layout of the first wiring layer 21 and the third wiring layer 23 is shown in FIG. 4 and FIG. 5.

Figure 9:
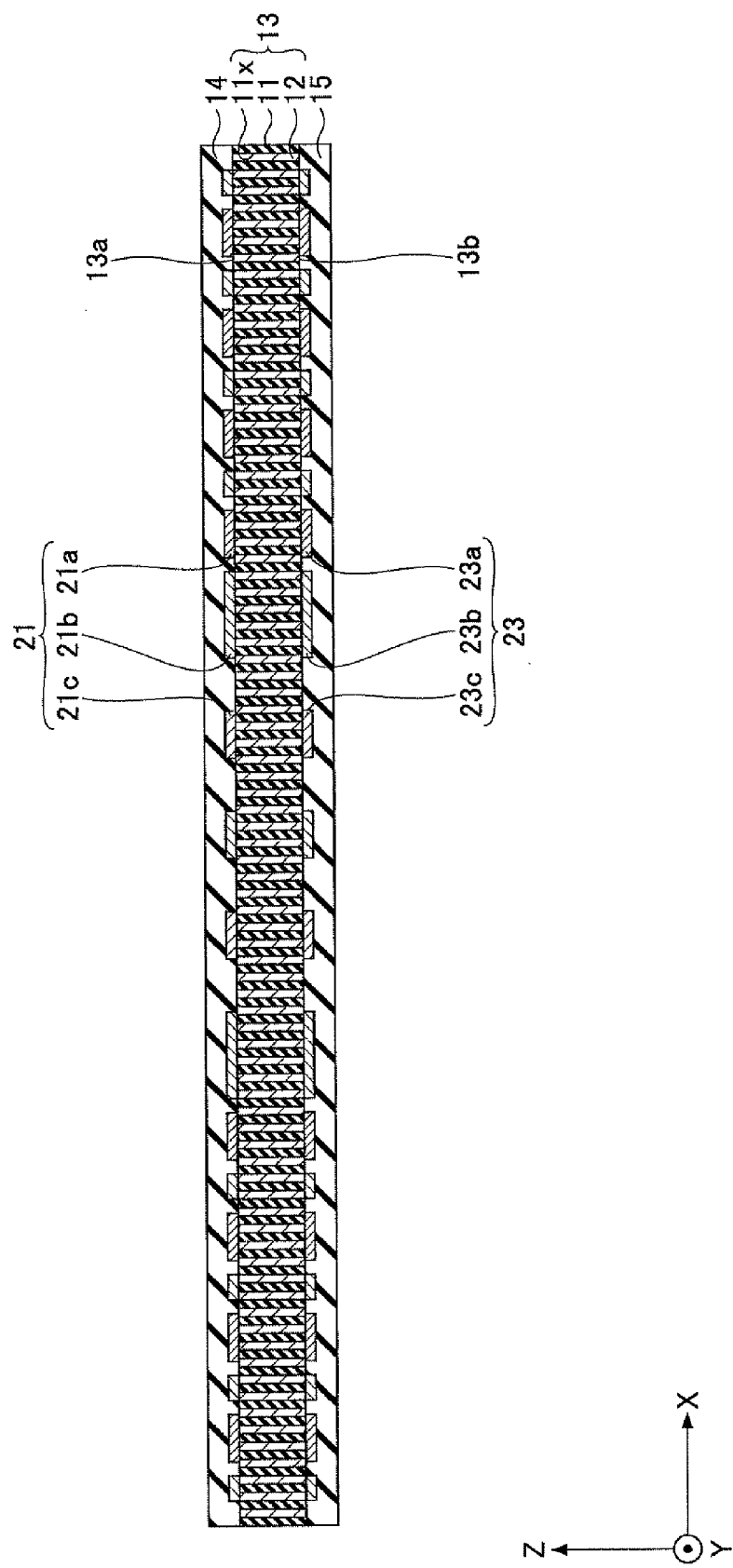
FIG. 9 is a fourth view of the example of the manufacturing method of the semiconductor device of the first embodiment of the present invention.

Next, in a step shown in FIG. 9, the first insulation layer 14 is formed on the surface 13a of the core substrate 13 so as to cover the first wiring layer 21. In addition, the second insulation layer 15 is formed on the surface 13b of the core substrate 13 so as to cover the third wiring layer 23. As the materials of the first insulation layer 14 and the second insulation layer 15, the resin materials such as the epoxy group resin or the polyimide group resin can be used. The first insulation layer 14 and the second insulation layer 15 are formed by, for example, laminating a resin film on the surfaces 13a and 13b of the core substrate 13 so that the first wiring layer 21 and the third wiring layer 23 are covered with the resin film, then pressing the resin film, and then applying a heating process at approximately 190° C. so that the resin film is cured.

Figure 10:
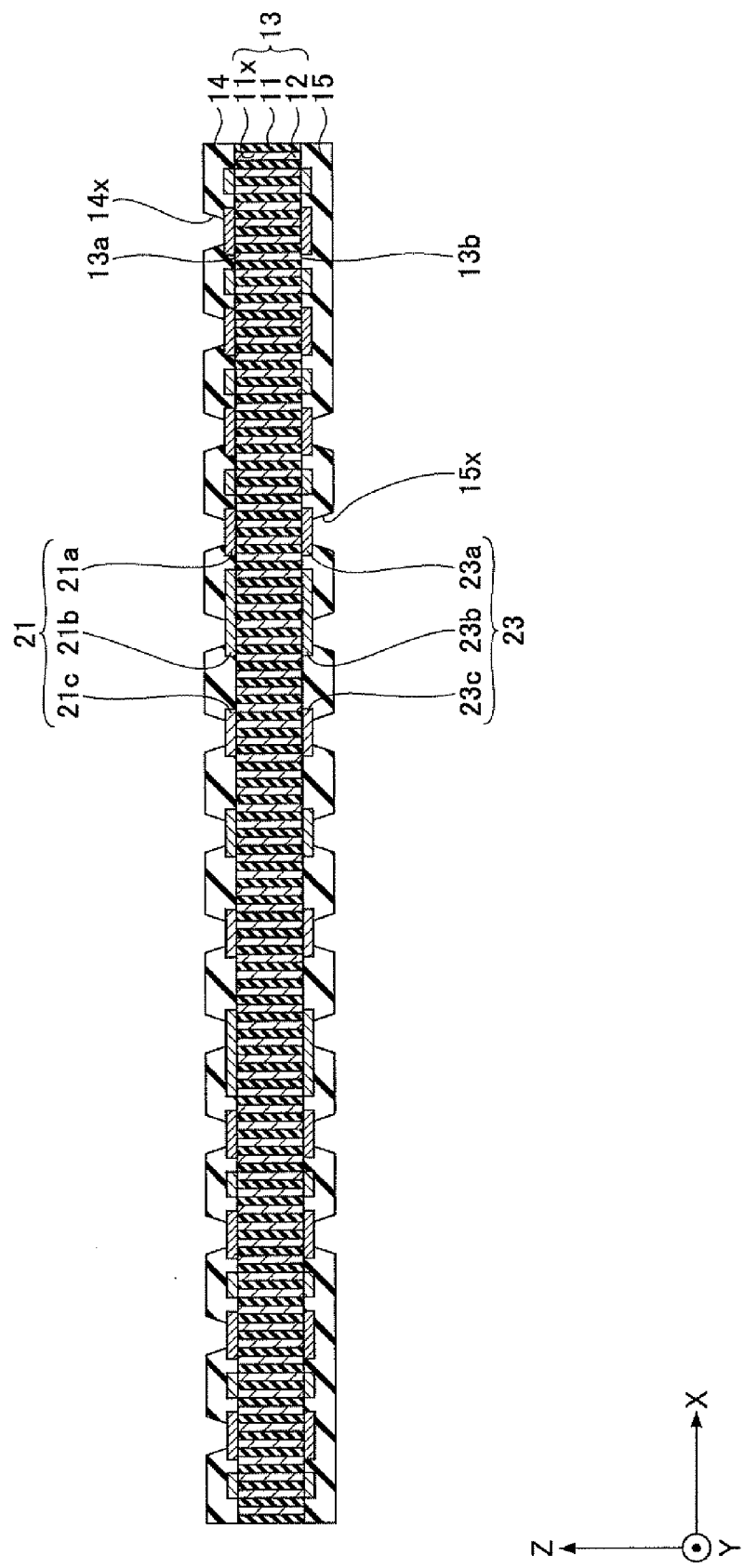
FIG. 10 is a fifth view of the example of the manufacturing method of the semiconductor device of the first embodiment of the present invention.

Next, in a step shown in FIG. 10, the first via-holes 14x configured to pierce the first insulation layer 14 are formed in the first insulation layer 14 by a laser processing method or the like so that the surface of the first wiring layer 21 is exposed. Furthermore, the second via-holes 15x configured to pierce the second insulation layer 15 are formed in the second insulation layer 15 by a laser processing method or the like so that the surface of the second wiring layer 23 is exposed.

The first via-holes 14x and others may be formed by using photosensitive resin as the first insulation layer 14 and the second insulation layer 15 and patterning with photolithography. The first via-holes 14x and others may be formed by patterning a resin film where opening parts are provided by screen printing.

Figure 11:
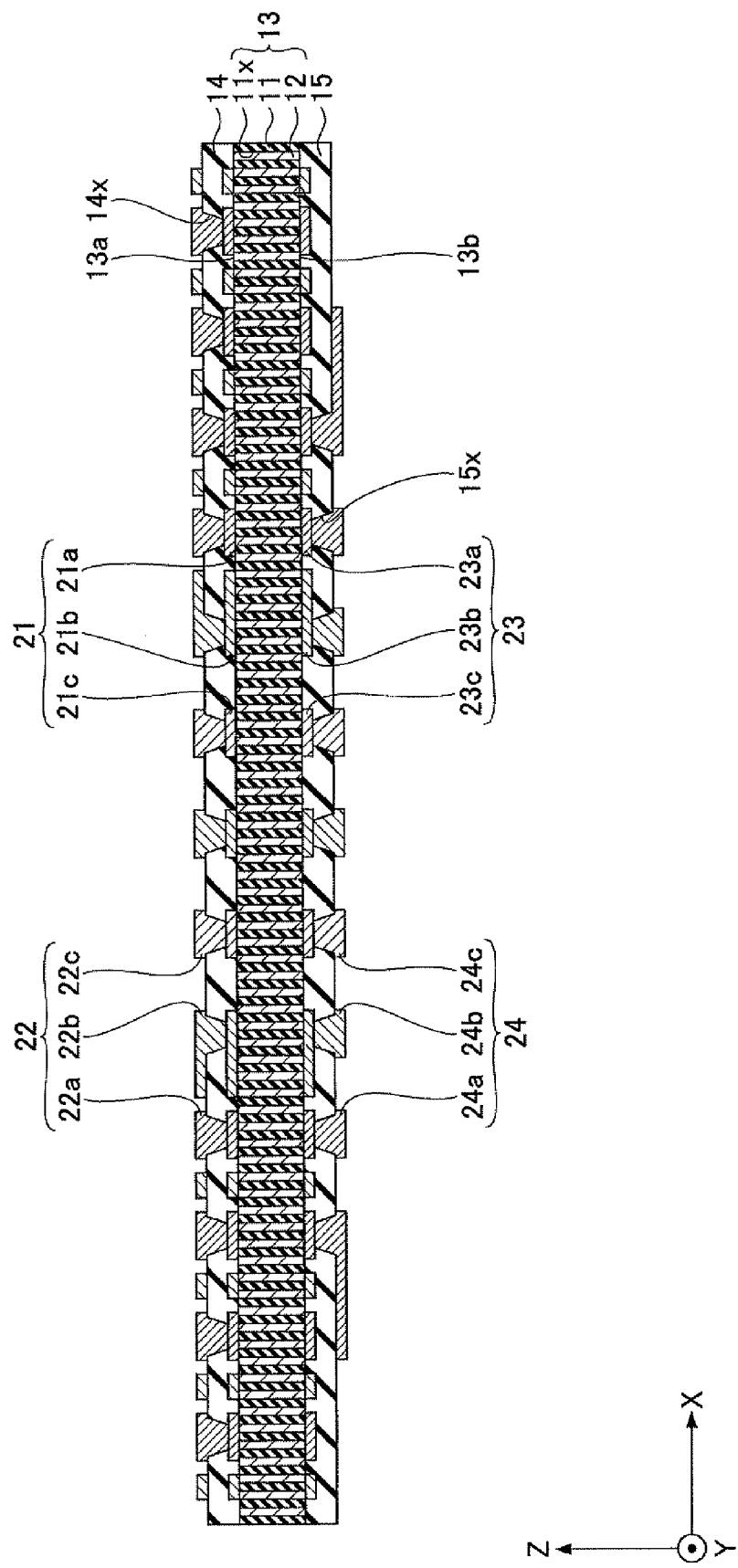
FIG. 11 is a sixth view of the example of the manufacturing method of the semiconductor device of the first embodiment of the present invention.

Next, in a step shown in FIG. 11, the second wiring layer 22 is formed on the first insulation layer 14. The second wiring layer 22 is configured to be electrically connected to the first wiring layer 21 exposed in the first via-holes 14x. In addition, the fourth wiring layer 24 is formed on the second insulation layer 15. The fourth wiring layer 24 is configured to be electrically connected to the third wiring layer 23 exposed in the second via-holes 15x. As the materials of the second wiring layer 22 and the fourth wiring layer 24, for example, copper (Cu) can be used. The second wiring layer 22 and the fourth wiring layer 24 are formed by, for example, a semi-additive process.

Details of an example where the second wiring layer 22 is formed by the semi-additive process are discussed below. First, by an electroless plating method or a sputtering method, a copper (Cu) seed layer (not shown) is formed on the first insulation layer 14 (including wall surfaces of the first via-holes 14x) and the first wiring layer 21 exposed in the first via-holes 14x. After that, a resist layer (not shown) having opening parts corresponding to the second wiring layer 22 is formed. Then, by using an electrolytic plating method where the copper (Cu) seed layer is used as a plating feeding layer, a copper (Cu) layer pattern (not shown) is formed in the opening parts of the resist layer.

Next, after the resist layer is removed, the copper (Cu) seed layer is etched by using a copper (Cu) layer pattern as a mask, so that the second wiring layer 22 is formed. Various kinds of wiring forming methods such as a subtractive process, in addition to the semi-additive process discussed above, can be used as the forming method of the second wiring layer 22. The fourth wiring layer 24 can be formed by the same method.

Figure 12:
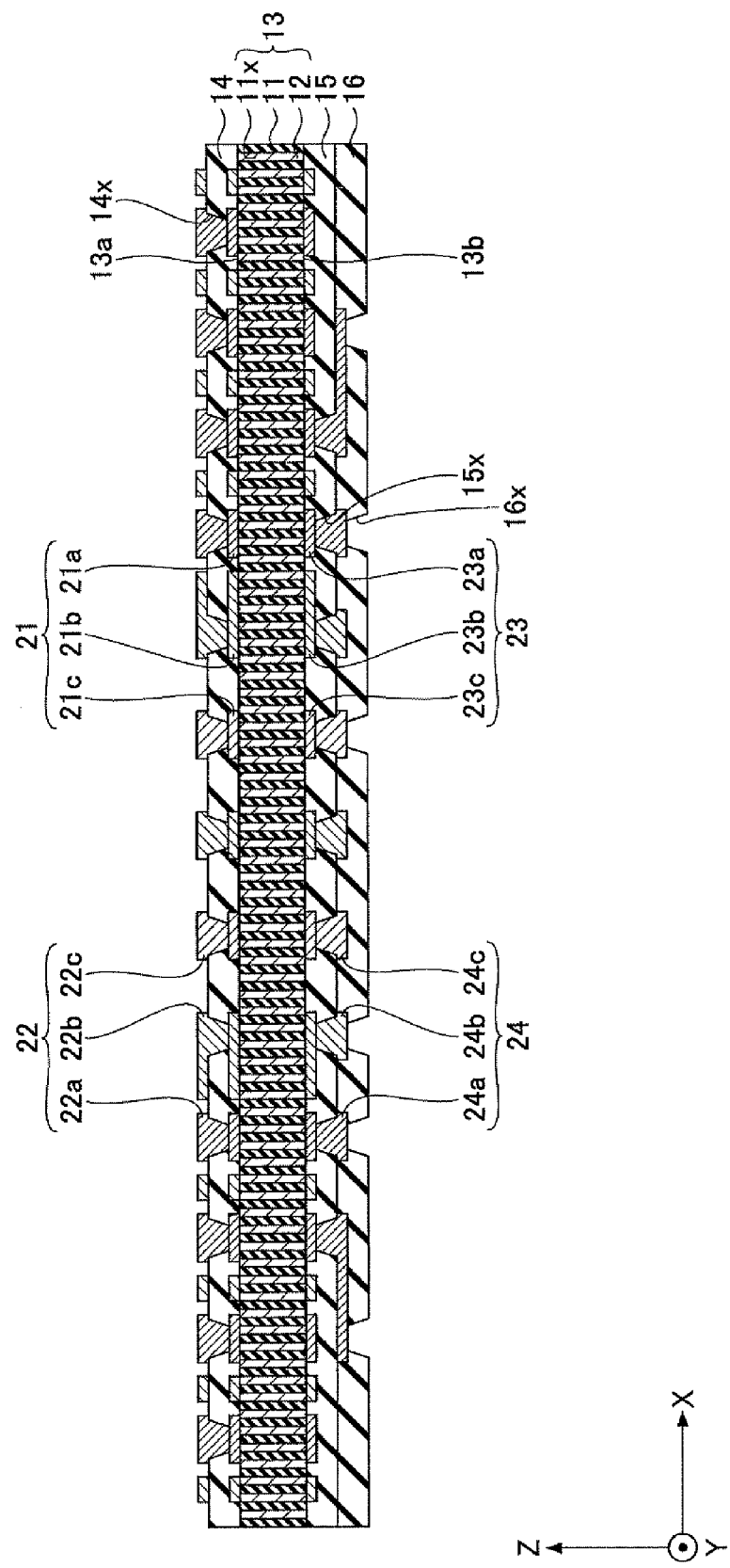
FIG. 12 is a seventh view of the example of the manufacturing method of the semiconductor device of the first embodiment of the present invention.

Next, in a step shown in FIG. 12, by the same steps shown in FIG. 9 and FIG. 10, the third insulation layer 16 is formed on the second insulation layer 15 so as to cover the fourth wiring layer 24. The third via holes 16x configured to pierce the third insulation layer 16 are formed so that the surface of the fourth wiring layer 24 is exposed. As the material of the third insulation layer 16, the resin materials such as the epoxy group resin or the polyimide group resin can be used.

Figure 13:
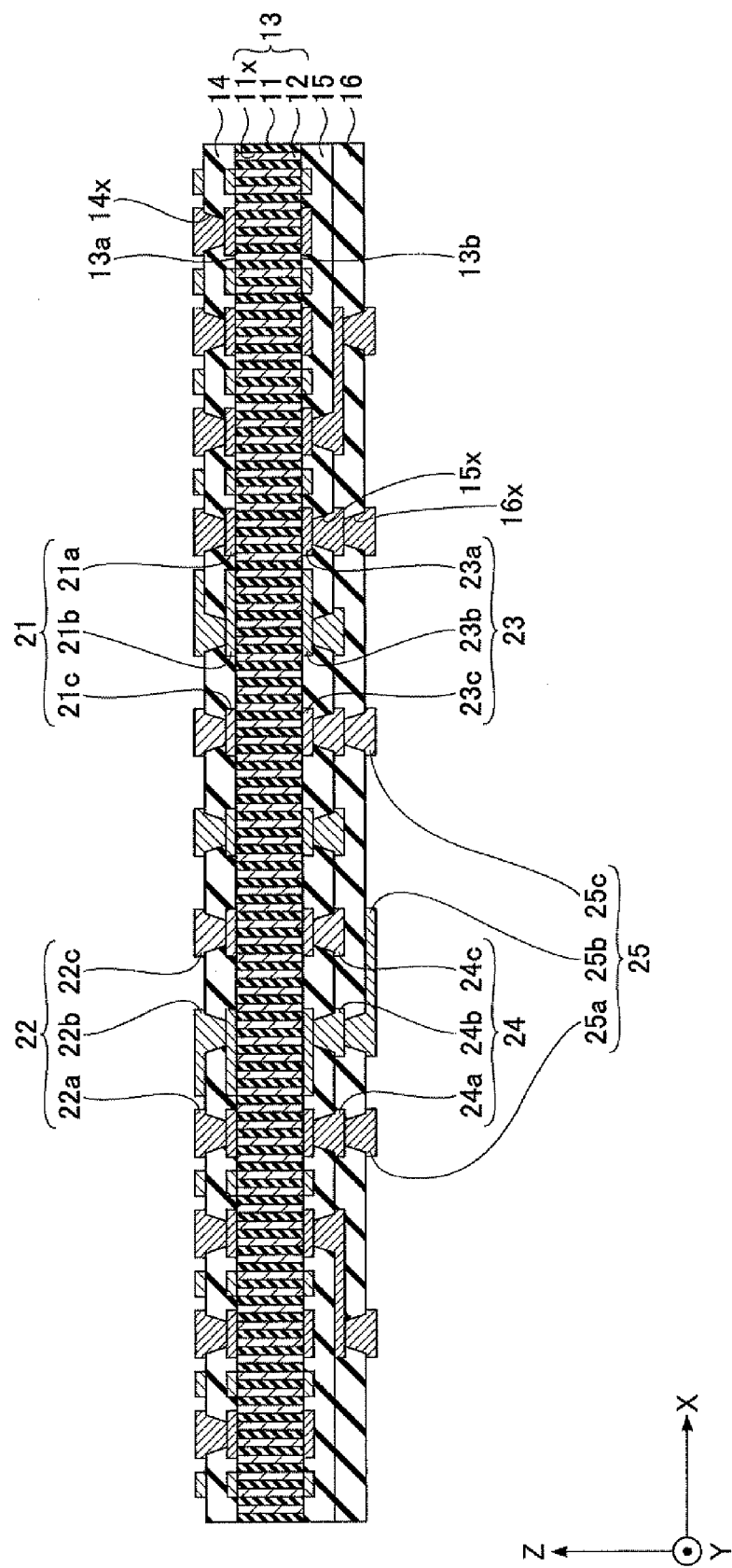
FIG. 13 is an eighth view of the example of the manufacturing method of the semiconductor device of the first embodiment of the present invention.

Next, in a step shown in FIG. 13, the fifth wiring layer 25 is formed on the third insulation layer 16. The fifth wiring layer 25 is configured to be electrically connected to the fourth wiring layer 24 exposed in the third via-holes 16x. As the material of the fifth wiring layer 25, for example, copper (Cu) can be used. The fifth wiring layer 25 is formed by, for example, the semi-additive process.

Figure 14:
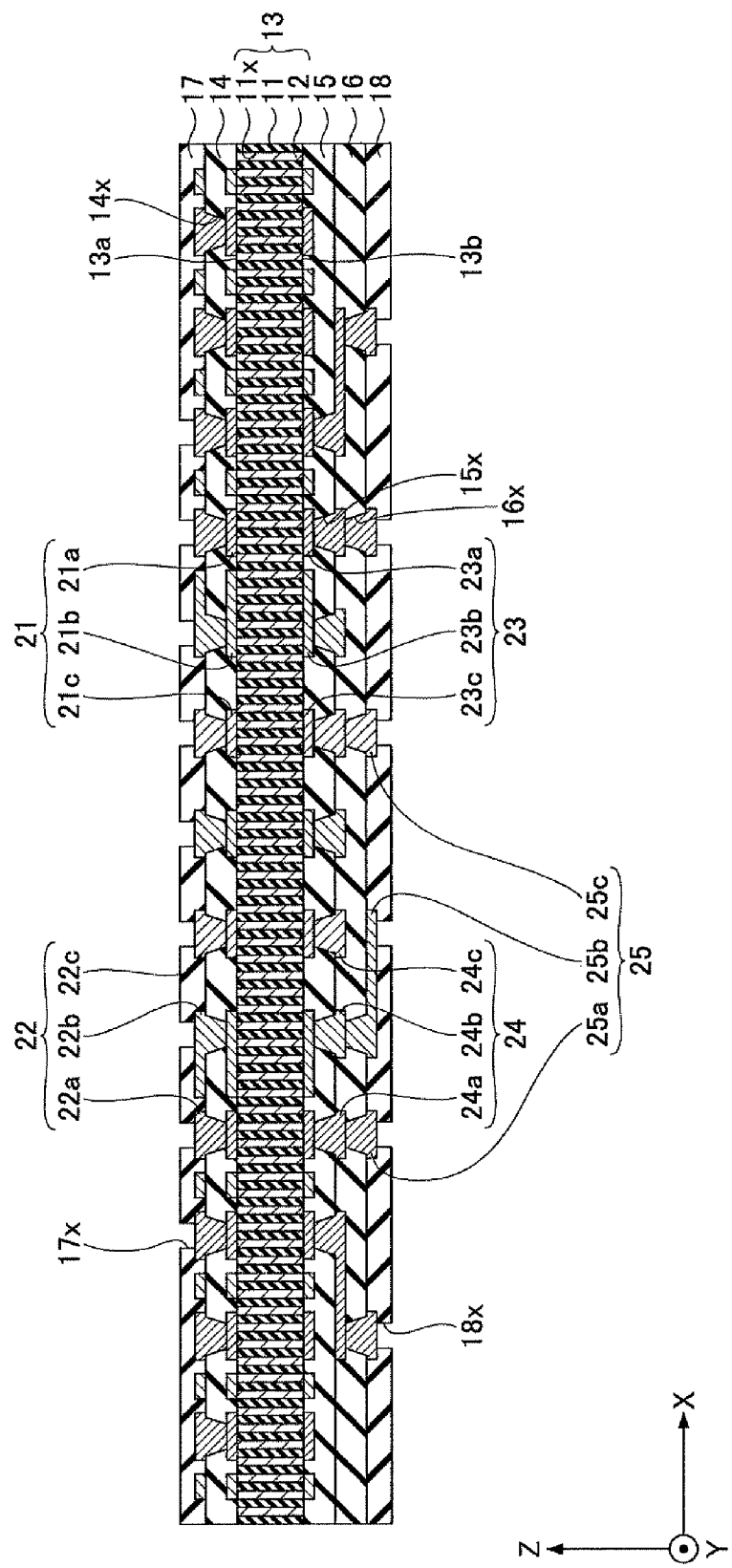
FIG. 14 is a ninth view of the example of the manufacturing method of the semiconductor device of the first embodiment of the present invention.

Next, in a step shown in FIG. 14, the first solder resist layer 17 having the opening parts 17x is formed on the first insulation layer 14 so as to cover the second wiring layer 22. In addition, the second solder resist layer 18 having the opening parts 18x is formed on the third insulation layer 16 so as to cover the fifth wiring layer 25. The first solder resist layer 17 having the opening parts 17x can be formed by applying solder resist liquid so that the second wiring layer 22 is covered and exposing and developing the applied solder resist liquid. The second solder resist layer 18 having the opening parts 18x can be formed by the same method as that of the first solder resist layer 17 having the opening parts 17x. As materials of the first solder resist layer 17 and the second solder resist layer 18, photosensitive resin compositions including, for example, epoxy group resin or imide group resin can be used.

A part of the second wiring layer 22 is exposed in the opening parts 17x of the first solder resist layer 17. A part of the fifth wiring layer 25 is exposed in the opening parts 18x of the second solder resist layer 18. A metal layer (not shown) may be formed on the second wiring layer 22 exposed in the opening parts 17x of the first solder resist layer 17 and on the fifth wiring layer 25 exposed in the opening parts 18x of the second solder resist layer 18 by, for example, an electroless plating method.

As the metal layer (not shown), for example, an Au layer, a Ni/Au layer (a Ni layer and the Au layer are stacked in this order), or a Ni/Pd/Au layer (the Ni layer, a Pd layer, and the Au layer are stacked in this order) may be formed. Instead of forming the metal layer, an OSP (Organic Solderability Preservative) process may be applied on the second wiring layer 22 exposed in the opening parts 17x of the first solder resist layer 17 and on the fifth wiring layer 25 exposed in the opening parts 18x of the second solder resist layer 18.

Figure 15:
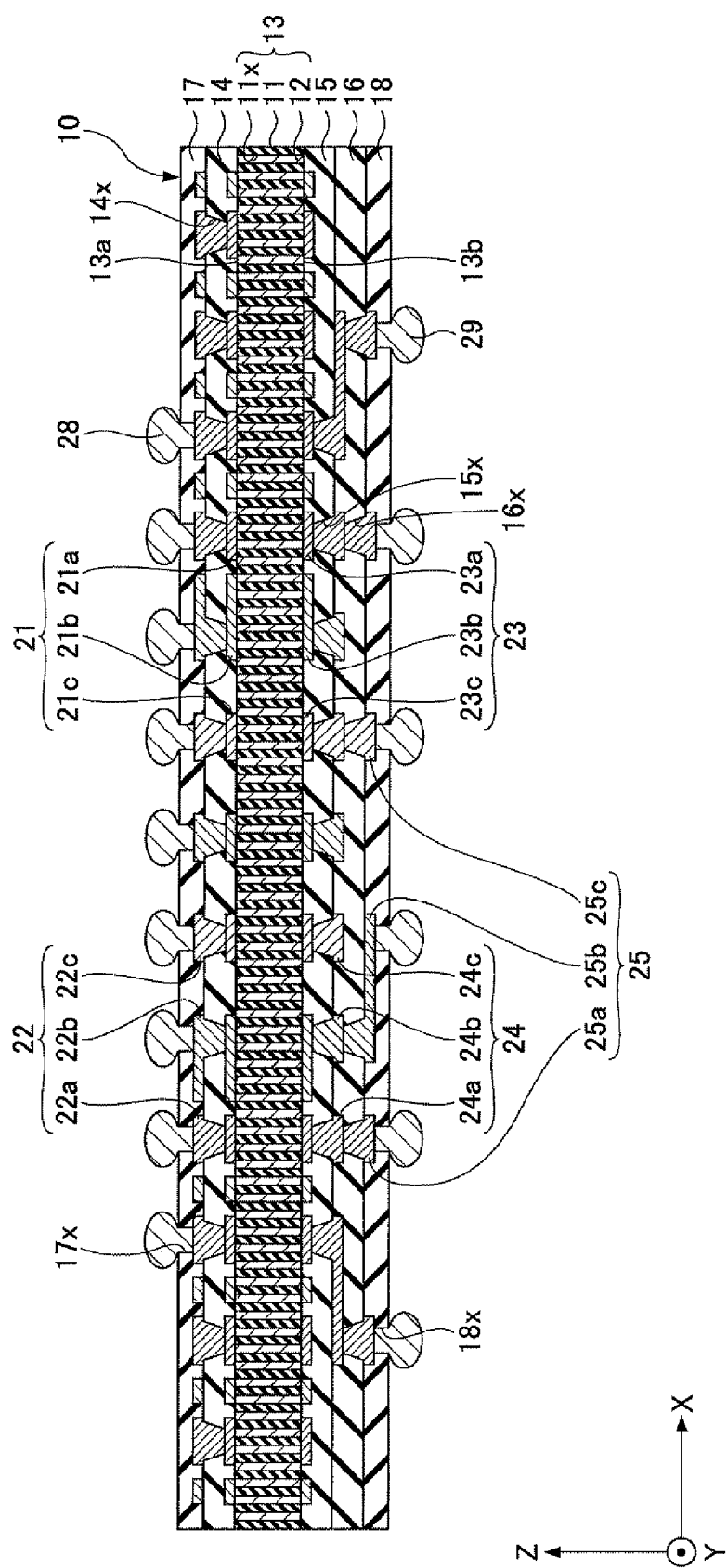
FIG. 15 is a tenth view of the example of the manufacturing method of the semiconductor device of the first embodiment of the present invention.

Next, in a step shown in FIG. 15, the first solder bumps 28 are formed on the second wiring layer 22 exposed in the opening parts 17x of the first solder resist layer 17 and the second solder bumps 29 are formed on the fifth wiring layer 25 exposed in the opening parts 18x of the second solder resist layer 18, and thereby the wiring board shown in FIG. 3 is manufactured. The first solder bumps 28 are formed by printing solder paste so that the second wiring layer 22 exposed in the opening parts 17x of the first solder resist layer 17 is covered and by applying a reflow process. The second solder bumps 29 are formed by the same method as that of the first solder bumps 28. As materials of the first solder bumps 28 and the second solder bumps 29, for example, an alloy including an alloy including Pb, an alloy of Sn and Cu, an alloy of Sn and Ag, an alloy of Sn, Ag, and Cu, and others can be used. The first solder bumps 28 function as the outside connecting terminals configured to be connected to the semiconductor element. The second solder bumps 29 function as the outside connecting terminals configured to be connected to, for example, the motherboard.

As the outside connection terminals, instead of the first solder bumps 28 and/or the second solder bumps 29, metal pins or the like can be used. In addition, the outside connection terminals such as the first solder bumps 28 and/or the second solder bumps 29, the metal pins, or the like may not be provided. In this case, depending on necessity (for example, when the wiring board 10 is shipped or the semiconductor element 30 is mounted), the outside connection terminals may be formed on the second wiring layer 22 exposed in the opening parts 17x of the first solder resist layer 17 and/or on the fifth wiring layer 25 exposed in the opening parts 18x of the second solder resist layer 18.

After the step shown in FIG. 15, by mounting the semiconductor element 30 on the wiring board 10, the semiconductor device 1 shown in FIG. 3 is manufactured.

Thus, according to the first embodiment of the present invention, the built-in capacitor where the ground wiring group A and the electric power supply group B are arranged by way of the insulation base member 11 is formed in the core substrate 13 having plural linear conductors 12 piercing from the first surface 13a to the second surface 13b of the insulation base member 13 including the inorganic dielectric. In addition, the insulation layers 14-16 and the wiring layers 21-25 are stacked on the core substrate 13 so that the wiring board 10 is formed. Then, the semiconductor element 30 is mounted on the wiring board 10.

As a result of this, the ground wiring group A and the electric power supply wiring group B can be provided right under an electrode terminal corresponding to the ground (GND) of the semiconductor element 20 and the electrode terminal corresponding to the electric power supply. Therefore, the semiconductor element 20 and the built-in capacitor of the wiring board 10 can be electrically connected to each other by an extremely short wiring. Inductance between the semiconductor element 20 and the built-in capacitor can be reduced.

In addition, a process required in the related art for the large capacity of the built-in capacitor where the insulation layers (dielectric layers) and the conductive layers (electrodes) are mutually stacked is not required in this embodiment. Therefore, it is possible to easily correspond to the large capacity.
(Modified Example of the First Embodiment)

Next, a modified example of the first embodiment of the present invention is discussed with reference to FIG. 16 through FIG. 20. In this modified example, a capacitor is formed in an area where the semiconductor element 30 of the semiconductor device 1 of the first embodiment is not mounted.

Figure 16:
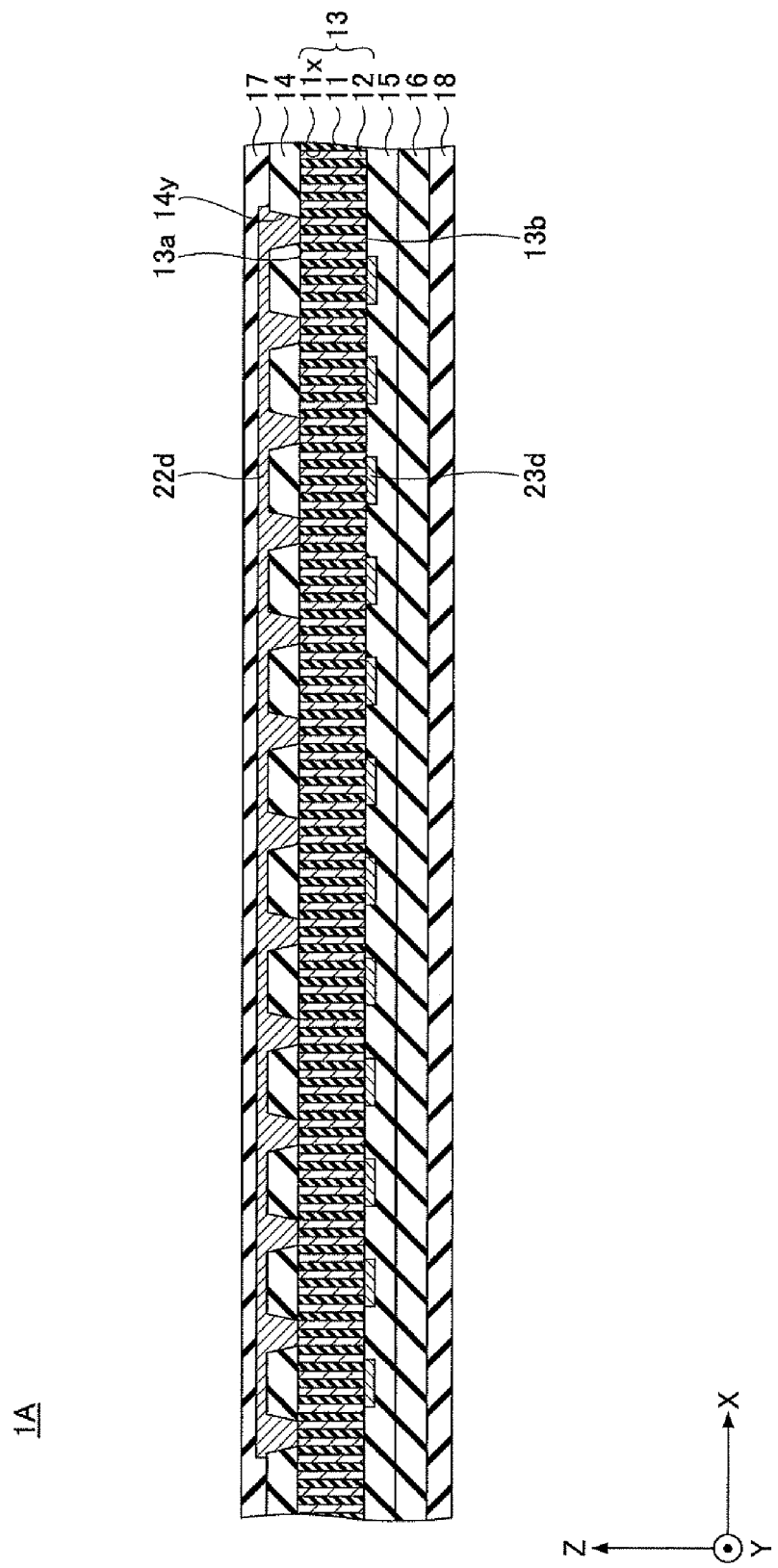
FIG. 16 is a cross-sectional view of a part of a semiconductor device of a modified example of the first embodiment of the present invention.
Figure 17:
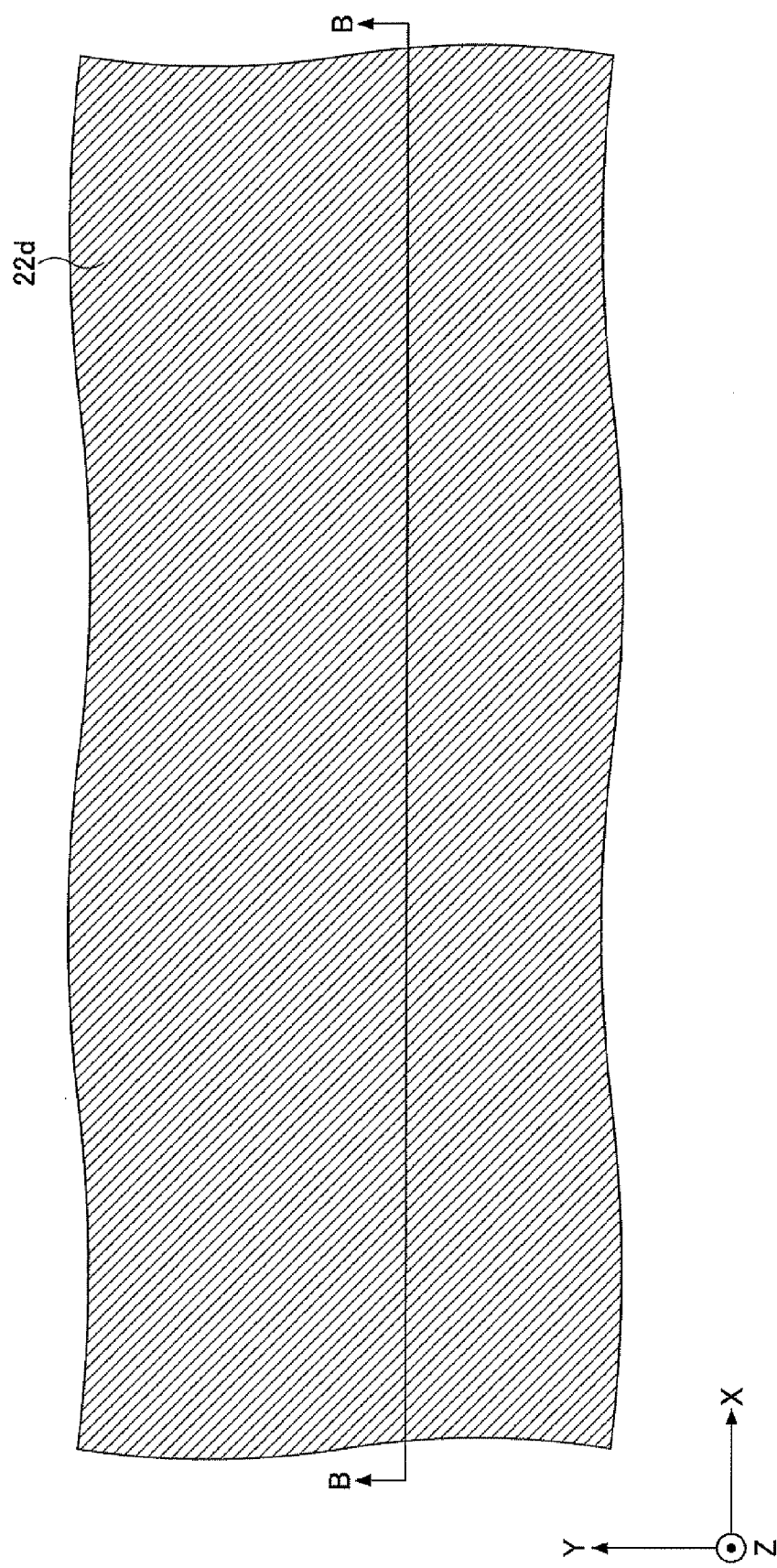
FIG. 17 is a plan view of an example of an electric power supply wiring layer of a second wiring layer formed on a first insulation layer.
Figure 18:
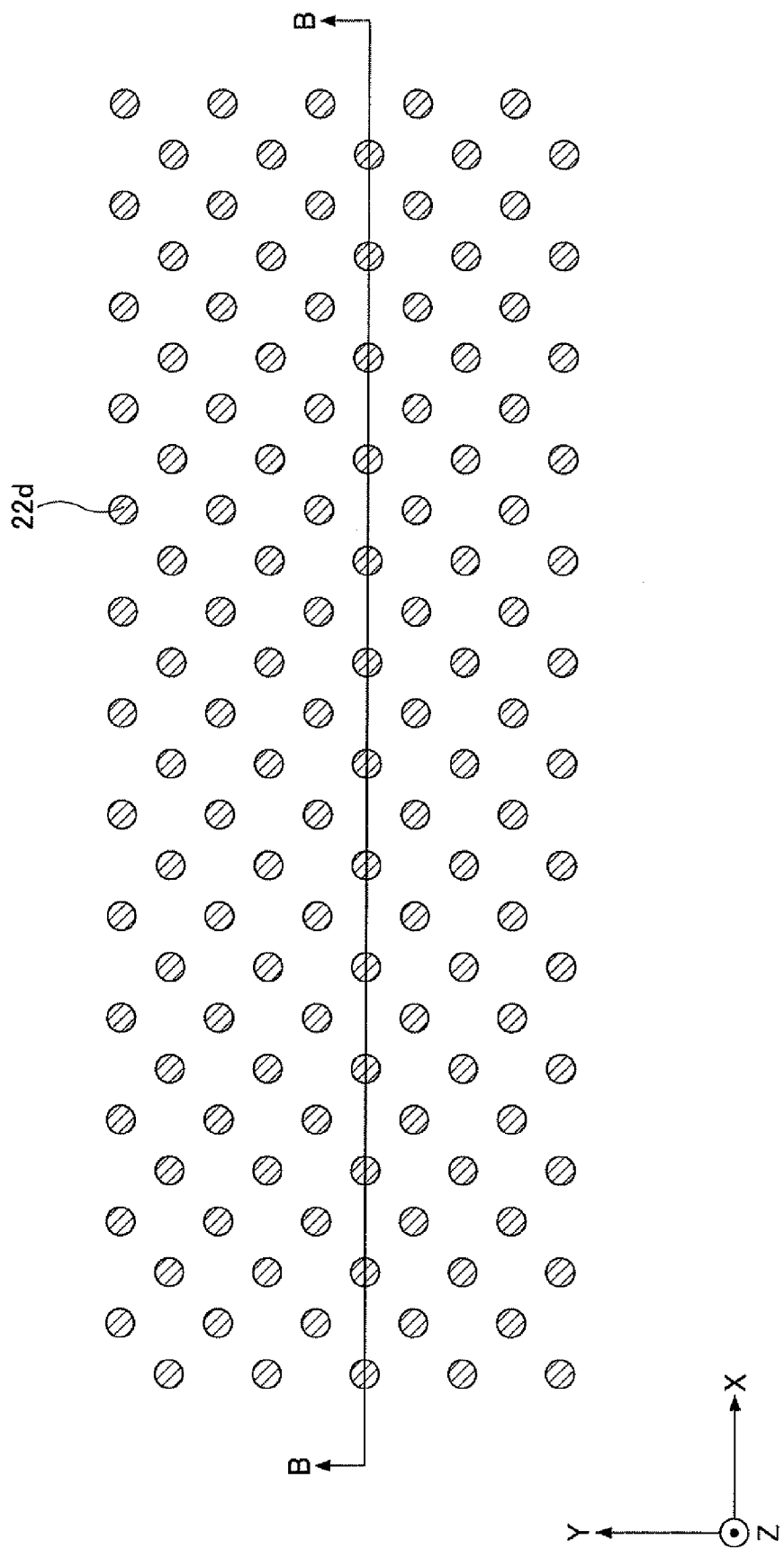
FIG. 18 is a plan view of an example of the electric power supply wiring layer of the second wiring layer at a part contacting one surface of a core substrate.
Figure 19:
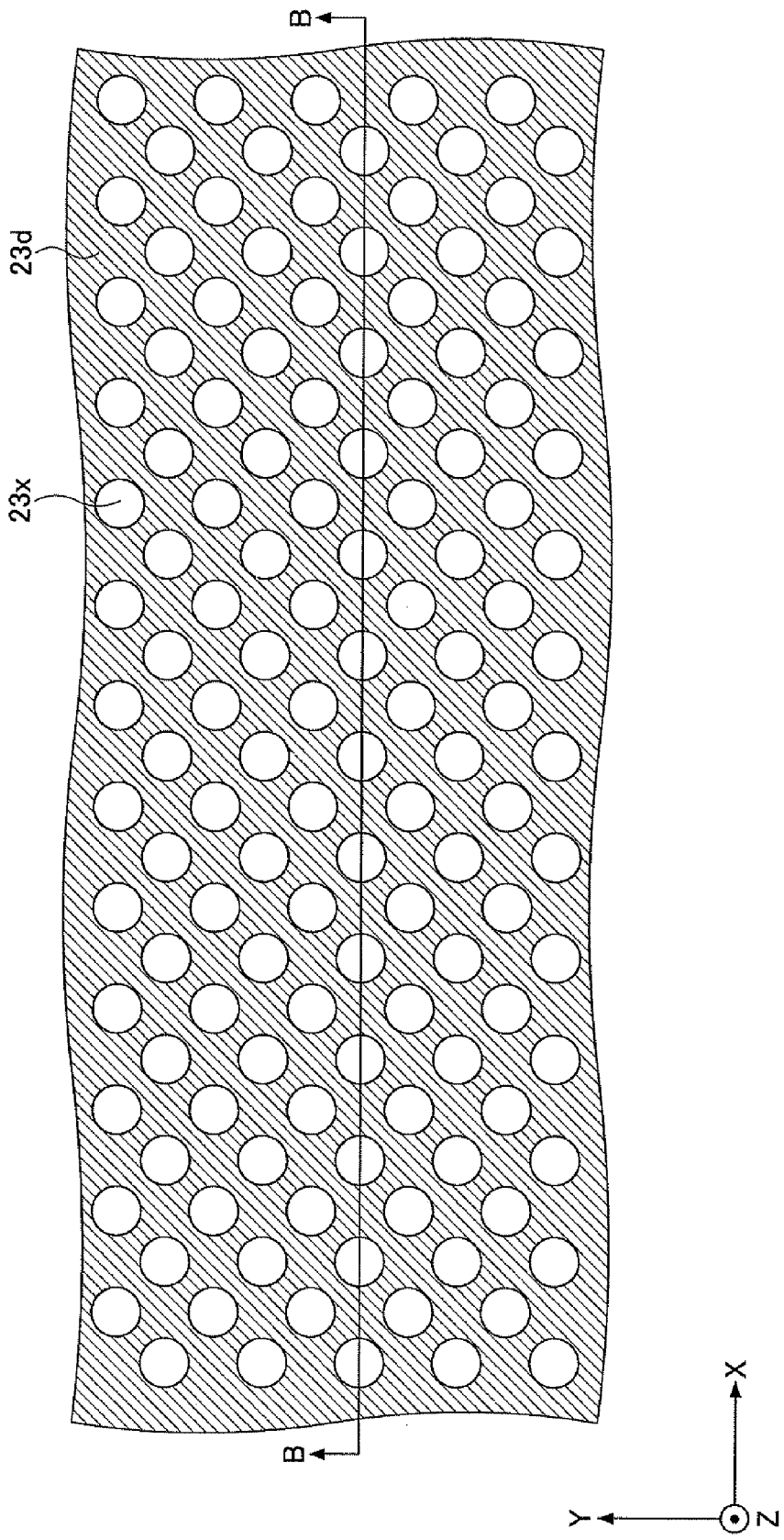
FIG. 19 is a plan view of an example of a ground wiring of a third wiring layer formed on another surface of the core substrate.
Figure 20:
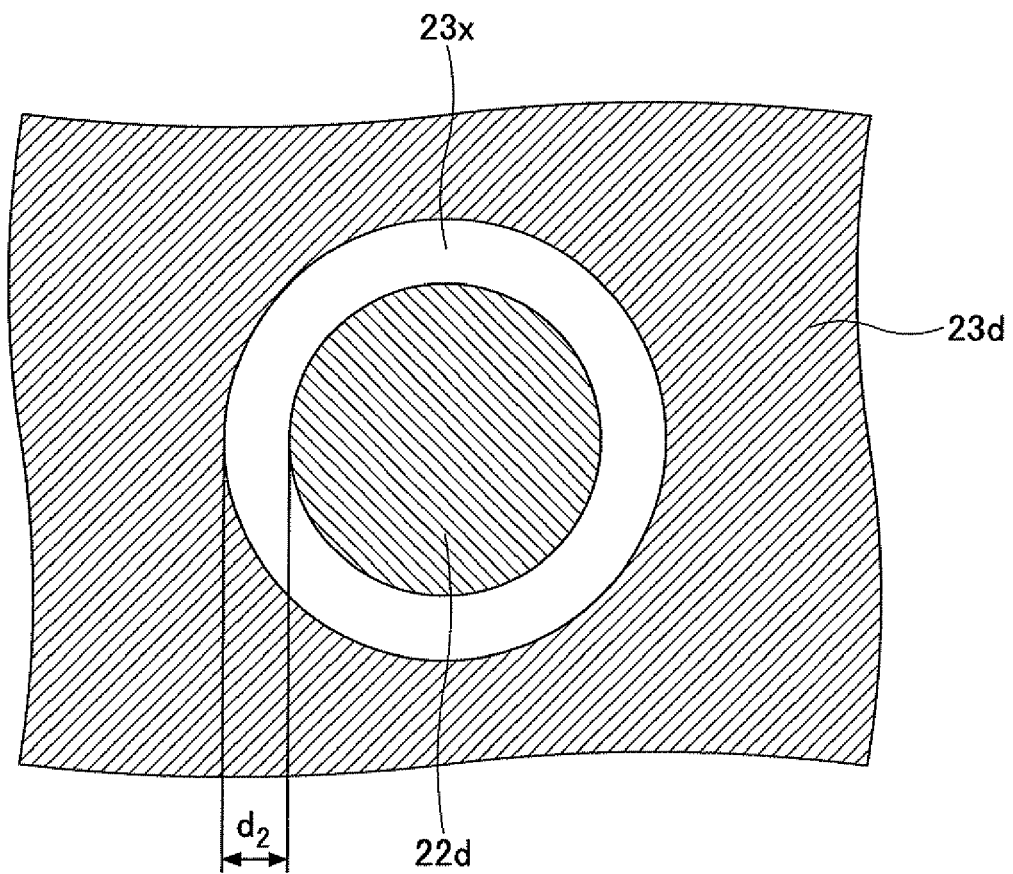
FIG. 20 is a plan view of an example of a positional relationship between the electric power supply wiring layer of the second wiring layer at the part contacting one surface of the core substrate and the opening part of the ground wire of the third wiring layer formed on another surface of the core substrate.

FIG. 16 is a cross-sectional view of a part of a semiconductor device 1A of the modified example of the first embodiment of the present invention. FIG. 17 is a plan view of an example of an electric power supply wiring layer of a second wiring layer formed on a first insulation layer. FIG. 18 is a plan view of an example of the electric power supply wiring layer of the second wiring layer at a part contacting one surface of a core substrate. FIG. 19 is a plan view of an example of a ground wiring of a third wiring layer formed on another surface of the core substrate. FIG. 20 is a plan view of an example of a positional relationship between the electric power supply wiring layer of the second wiring layer at the part contacting one surface of the core substrate and the opening part of the ground wire of the third wiring layer formed on another surface of the core substrate. FIG. 16 through FIG. 20 shows the area where the semiconductor element 30 of the semiconductor device 1A is not mounted. FIG. 16 shows a cross section taken along a line B-B of FIG. 17 through FIG. 19. In FIG. 16 through FIG. 20, parts that are the same as the parts of the semiconductor device 1 shown in FIG. 3 are given the same reference numerals, and explanation thereof is omitted.

As shown in FIG. 16 and FIG. 17, in an area where the semiconductor element 30 of the semiconductor device 1A is not mounted, the electric power supply wiring 22d of the second wiring layer 22 is formed so as to cover a designated region on the first insulation layer 14. In addition, as shown in FIG. 16, the electric power supply wiring 22d is electrically connected to end surfaces of plural linear conductors 12 exposed on the surface 13a of the core substrate 13. As shown in FIG. 18, the electric power supply wiring 22d at the bottom part of the first via-holes 14y has, for example, a circular-shaped configuration in planar view. The electric power supply wirings 22d are arranged, for example, in a hexagonal manner.

As shown in FIG. 16 and FIG. 19, in the area where the semiconductor element 30 of the semiconductor device 1A is not mounted, the ground wiring (second conductive layer) 23d having the opening parts 23x of the third wiring layer 23 is formed so as to cover a designated area of the surface 13b of the core substrate 13. The ground wiring 23d is electrically connected to the end surfaces of plural linear conductors 12 exposed on the surface 13b of the core substrate 13. As shown in FIG. 20, the opening part 23x has a diameter greater than a portion (see FIG. 18) of the electric power supply wiring (first conductive layer) 22d, the opening part 23x coming in contact with the surface 13a of the core substrate 13. The opening part 23x is situated in a position (overlapping position in the planar view) facing the portion of the electric power supply wiring 22d, the portion coming in contact with the surface 13a of the core substrate 13. In other words, the ground wiring 23d and the portion (see FIG. 18) of the electric power supply wiring 22d arranged in a polka-dot pattern do not face each other (are not overlapped in the planar view).

Thus, a ground wiring group (hereinafter a ground wiring group E) having the ground wiring 23d and a large number of the linear conductors 12 configured to connect the ground wiring 23d and an electric power supply wiring group (hereinafter an electric power supply wiring F) having the electric power supply wiring 22d and a large number of the linear conductors 12 configured to connect the electric power supply wiring 22d are not electrically connected, but are capacity coupled by way of the insulation base member 11 which is made of an inorganic dielectric. In other words, the ground wiring group E and the electric power supply wiring group F form a capacitor (hereinafter second built-in capacitor) where the ground wiring group E works as one electrode and the electric power supply wiring group F works as another electrode. A distance $d_2$ between the ground wiring group E and the electric power supply wiring group F, namely a distance between the electrodes of the second built-in capacitor, can be, for example, approximately 5 μm. As the distance $d_2$ is narrower, the capacity of the second built-in capacitor can be larger. In addition, as an area of a surface where the ground wiring group E and the electric power supply wiring group F face each other is greater, the capacity of the second built-in capacitor can be larger.

Thus, according to the modified example of the first embodiment of the present invention, it is possible to achieve the same effect as that of the first embodiment and further achieve the following capability.

That is, in the semiconductor device of the modified example of the first embodiment, the capacitor which can correspond to large capacity can be formed in the area where the semiconductor element is not mounted.

(Second Embodiment)

Figure 21:
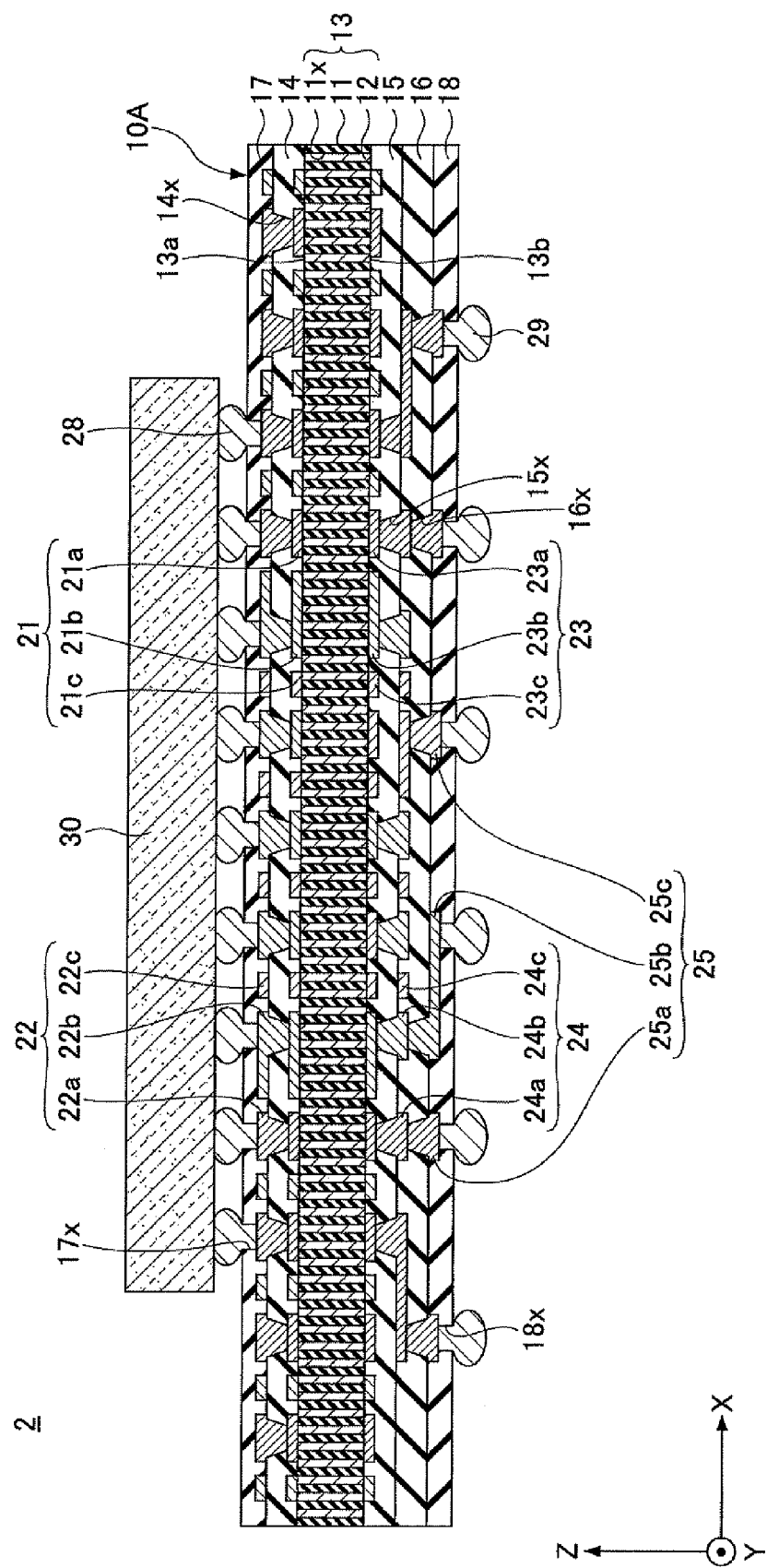
FIG. 21 is a cross-sectional view of an example of a semiconductor device of a second embodiment of the present invention.

FIG. 21 is a cross-sectional view of an example of a semiconductor device of a second embodiment of the present invention. FIG. 21 shows a cross section taken along a line C-C of FIG. 22. In FIG. 21, parts that are the same as the parts of the semiconductor device 1 shown in FIG. 3 are given the same reference numerals, and explanation thereof is omitted. In FIG. 21, an x direction is a direction parallel with the surface 13a of the core substrate 13. A Y direction (a depth direction of a drawing) indicates a direction perpendicular to the X direction. A Z direction (a thickness direction of the core substrate 13) indicates a direction perpendicular to the X direction and the Y direction.

Referring to FIG. 21, a semiconductor device 2 of the second embodiment has the same structure as that of the semiconductor device 1 of the first embodiment except that the wiring board 1 is replaced with a wiring board 10A in the second embodiment. In the following explanation, explanation of parts of the semiconductor device 2 having the same structure as those of the semiconductor device 1 is omitted, and parts different from the semiconductor device 1 are mainly discussed.

Figure 22:
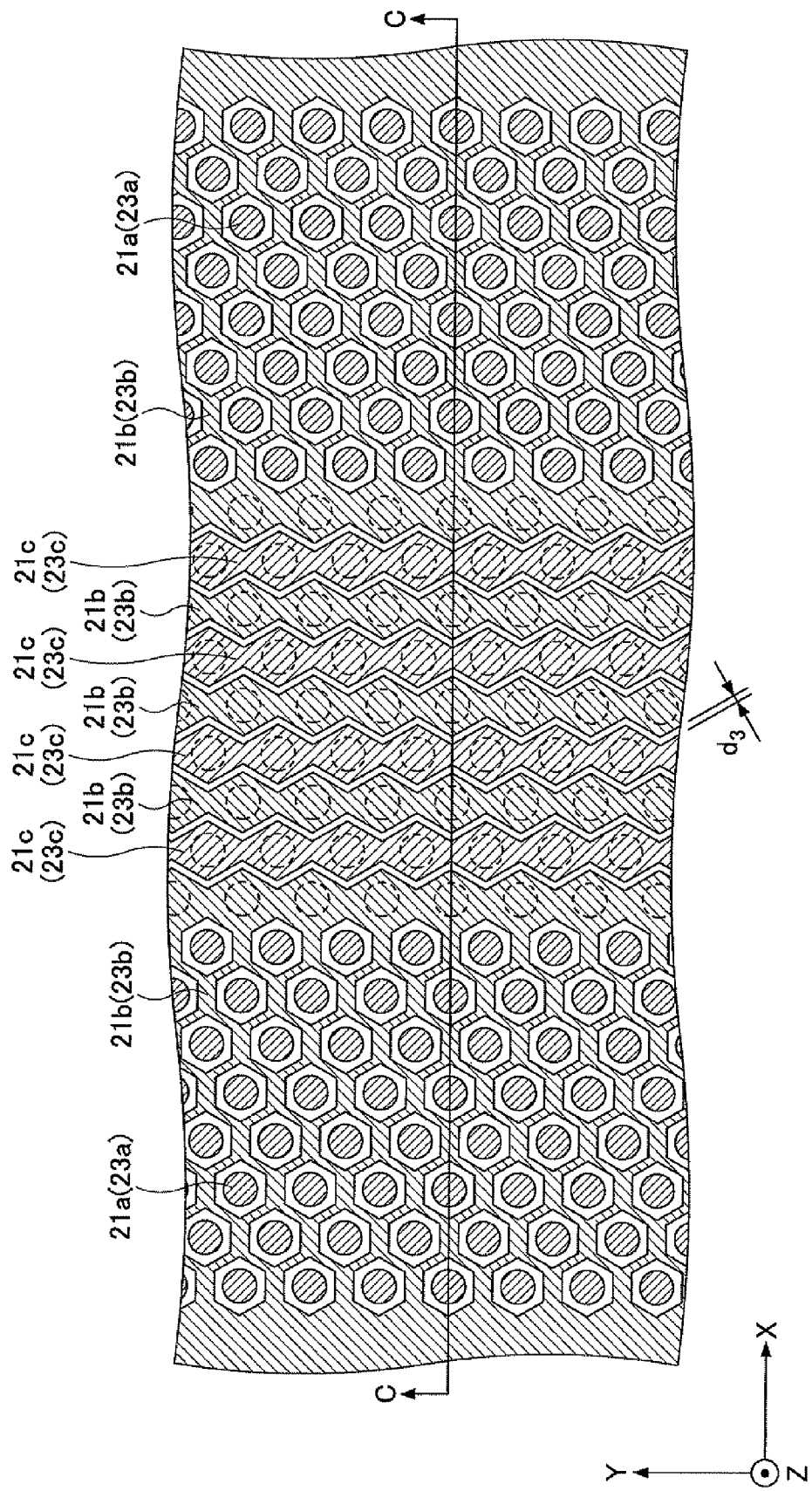
FIG. 22 is a plan view of an example of a layout of a first wiring layer and a third wiring layer of a wiring board of the second embodiment of the present invention.
Figure 23:
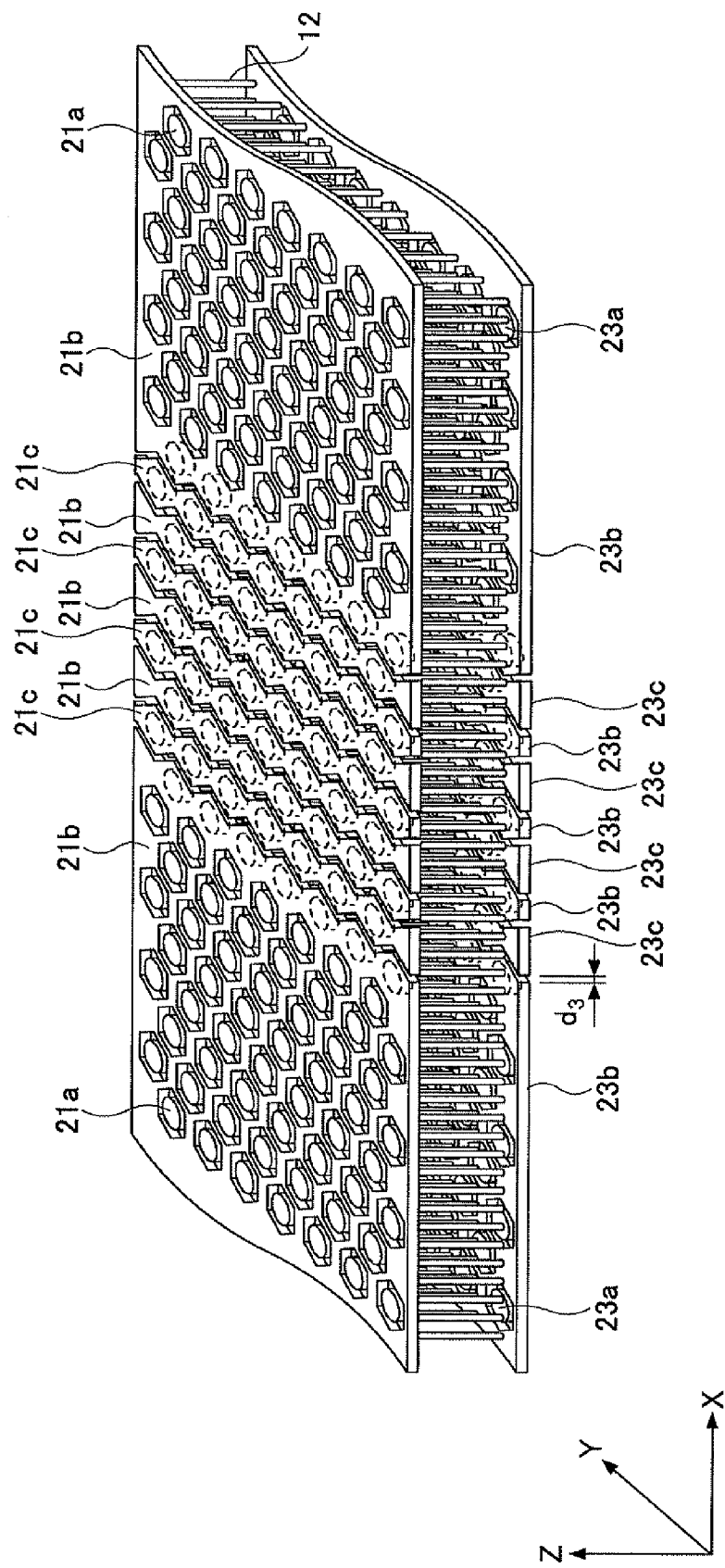
FIG. 23 is a perspective view of an example of a layout of the first wiring layer and the third wiring layer of the wiring board of the second embodiment of the present invention.

FIG. 22 is a plan view of an example layout of a first wiring layer and a third wiring layer of the wiring board 10A of the second embodiment of the present invention. FIG. 23 is a perspective view of an example layout of the first wiring layer and the third wiring layer of the wiring board 10A of the second embodiment of the present invention. In FIG. 22 and FIG. 23, parts that are the same as the parts of the semiconductor device 1 shown in FIG. 4 and FIG. 5 are given the same reference numerals, and explanation thereof is omitted.

As shown in FIG. 22 and FIG. 23, the wiring board 10A of the second embodiment is different from the wiring board 10 of the first embodiment in that parts (indicated by circles) of the signal wires 21a (23a), the ground wiring 21b (23b), and the electric power supply wiring 21c (23c) coming in contact with the surfaces 13a and 13b of the core substrate 13 are arranged in a hexagonal manner.

In addition, the wiring board 10A is also different from the wiring board 10 on the following point. That is, each of parts of the belt-shape ground wiring 21b (23b) and the belt-shape electric power supply wiring 21c (23c) mutually arranged in the X direction, the parts facing each other, has a concave part and a convex part. A concave part of the ground wiring 21b (23b) corresponds to a convex part of the electric power supply wiring 21c (23c). A convex part of the ground wiring 21b (23b) corresponds to a concave part of the electric power supply wiring 21c (23c). Although, in the example shown in FIG. 22 and FIG. 23, the concave part and convex part of each of parts of the ground wiring 21b (23b) and the electric power supply wiring 21c (23c), the parts facing each other, has a zigzag configuration, the configuration is not limited to the zigzag configuration but may be a wave-shaped configuration. Other portions of the wiring board 10A have the same structure as the wiring board 10.

Thus, a ground wiring group (hereinafter a ground wiring group G) having the belt-shaped ground wirings 21b and 23b and a large number of the linear conductors 12 configured to connect the ground wirings 21b and 23b and an electric power supply wiring group (hereinafter an electric power supply wiring H) having the belt-shaped electric power supply wirings 21c and 23c and a large number of the linear conductors 12 configured to connect the electric power supply wirings 21c and 23c mutually face each other by way of the insulation base member 11. In addition, the insulation base member 11 is made of an inorganic dielectric having a high dielectric constant such as alumina (aluminum oxide).

In other words, the ground wiring group G and the electric power supply wiring group H are mutually arranged by way of the inorganic dielectric (insulation base member 11) so that a capacitor (hereinafter built-in capacitor) is formed. In the built-in capacitor, the ground wiring group G works as one electrode and the electric power supply wiring group H works as another electrode. A distance $d_3$ between the ground wiring group G and the electric power supply wiring group H, namely a distance between the electrodes of the built-in capacitor, can be, for example, approximately 5 μm. As the distance $d_3$ is narrower, the capacity of the built-in capacitor can be larger. In addition, as an area of a surface where the ground wiring group G and the electric power supply wiring group H face each other is greater, the capacity of the built-in capacitor can be larger. Thus, the capacitor is built into the wiring board 10A and the built-in capacitor can correspond to a large capacity.

In the meantime, as discussed above, each of parts of the belt-shape ground wiring 21b (23b) and the belt-shape electric power supply wiring 21c (23c) mutually arranged in the X direction, the parts facing each other, has a concave part and a convex part. A concave part of the ground wiring 21b (23b) corresponds to a convex part of the electric power supply wiring 21c (23c). A convex part of the ground wiring 21b (23b) corresponds to a concave part of the electric power supply wiring 21c (23c). Because of this, the area of the surfaces of the ground wiring group G and the electric power sully wiring group H facing each other can be made larger than the area of the surfaces of the ground wiring group A and the electric power supply wiring group B facing each other. As a result of this, the capacity of the built-in capacitor per the same area in the wiring board 10A of the second embodiment can be made greater than that of the wiring board 10 of the first embodiment.

Thus, according to the second embodiment of the present invention, it is possible to achieve the same effect as the first embodiment and further achieve the following advantage.

That is, the capacity of the built-in capacitor per the same area can be made greater in the wiring board and the semiconductor device of the second embodiment compared to the wiring board and the semiconductor device of the first embodiment.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that the various changes, substitutions, and alterations could be made hereto without departing from the spirit and scope of the invention.

For example, modification substantially the same as the modified example of the first embodiment may be applied to the second embodiment.

According to the above-discussed embodiments of the present invention, it is possible to provide a wiring board inside which a capacitor is provided, which capacitor can correspond to mass storage, which wiring board can reduce inductance between the capacitor and a semiconductor element when the semiconductor element is mounted on the wiring board, and a semiconductor device where the semiconductor element is mounted on the wiring board.

What is claimed is:

1. A wiring board, comprising:
a core substrate, the core substrate including
   an insulation base member including inorganic dielectric, and
   a plurality of linear conductors, the linear conductors being configured to pierce from a first surface of the insulation base member to a second surface of the insulation base member, the linear conductors including a first linear conductor, a second linear conductor, and a third linear conductor;
a ground wiring group, the ground wiring group including
   a belt-shaped first ground wiring formed on the first surface of the core substrate, and
   a belt-shaped second ground wiring formed on the second surface of the core substrate so as to face the first ground wiring, the second ground wiring being electrically connected to the first ground wiring by way of the first linear conductor; and
an electric power supply wiring group, the electric power supply wiring group including
   a belt-shaped first electric power supply wiring formed on the first surface of the core substrate, and
   a belt-shaped second electric power supply wiring formed on the second surface of the core substrate so as to face the first electric power supply wiring, the second electric power supply wiring being electrically connected to the first electric power supply wiring by way of the second linear conductor;
wherein the ground wiring group and the electric power supply wiring group are formed by way of the insulation base member so that a capacitor is formed,
wherein the third linear conductor is provided between the ground wiring group and the electric power supply wiring group, and is electrically isolated.

2. The wiring board as claimed in claim 1,
wherein plural of the ground wiring groups and plural of the electric power supply groups are provided; and
the ground wiring groups and the electric power supply groups are mutually provided by way of the insulation base member.

3. The wiring board as claimed in claim 1,
wherein each of parts of the first ground wiring and the first electric power supply wiring has a concave part and a convex part;
the first ground wiring and the first electric power supply wiring are arranged so that the concave part of the first electric power supply wiring corresponds to the convex part of the first ground wiring and the convex part of the first electric power supply wiring corresponds to the concave part of the first ground wiring;
each of parts of the second ground wiring and the second electric power supply wiring has a concave part and a convex part; and
the second ground wiring and the second electric power supply wiring are arranged so that the concave part of the second electric power supply wiring corresponds to the convex part of the second ground wiring and the convex part of the second electric power supply wiring corresponds to the concave part of the second ground wiring.

4. The wiring board as claimed in claim 1, further comprising:
a first conductive layer formed on the first surface of the core substrate and arranged in a polka-dot pattern; and
a second conductive layer formed on the second surface of the core substrate, facing the first conductive layer, and having an opening part having an area greater than that of the first conductive layer,
wherein the first conductive layer is electrically connected to the electric power supply wiring group or the ground wiring group; and
the second conductive layer is electrically connected to the electric power supply wiring group or the ground wiring group which is not connected to the first conductive layer.

5. The wiring board as claimed in claim 1,
wherein the linear conductors are arranged so that a distance between neighboring linear conductors is shorter than a diameter of the linear conductors.

6. The wiring board as claimed in claim 1,
wherein the second linear conductor surrounds the first linear conductor.

7. The wiring board as claimed in claim 6,
wherein the third linear conductor is provided between the first linear conductor and the second linear conductor, and is electrically not-connected.

8. The wiring board as claimed in claim 1,
wherein a diameter of the linear conductors is equal to or greater than 30 nm and equal to or less than 2000 nm.

9. A semiconductor device, comprising:
the wiring board as claimed in claim 1; and
a semiconductor element mounted on the wiring board,
wherein the belt shaped first ground wiring is provided right under a plurality of electrode terminals corresponding to a ground of the semiconductor element; and
the belt shaped first electric power supply wiring is provided right under a plurality of electrode terminals corresponding to an electric power supply of the semiconductor element.

10. The semiconductor device as claimed in claim 1,
wherein the first surface of the core substrate is situated right under an electrode terminal corresponding to a signal wiring of a semiconductor element;
pads electrically connected to the electrode terminal corresponding to the signal wiring of the semiconductor element are provided on the first surface of the core substrate;
a part of the pads is connected to the second surface of the core substrate by way of a part of the linear conductors without being exposed at the first surface of the core substrate so as to be exposed at the second surface of the core substrate.

* * * * *